(12) United States Patent
Takamine

(10) Patent No.: US 8,339,221 B2
(45) Date of Patent: Dec. 25, 2012

(54) ELASTIC WAVE FILTER DEVICE HAVING NARROW-PITCH ELECTRODE FINGER PORTIONS

(75) Inventor: Yuichi Takamine, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 96 days.

(21) Appl. No.: 13/044,647

(22) Filed: Mar. 10, 2011

(65) Prior Publication Data

US 2011/0156841 A1 Jun. 30, 2011

(30) Foreign Application Priority Data

Sep. 22, 2008 (JP) ................................. 2008-243143

(51) Int. Cl.
*H03H 9/64* (2006.01)
(52) U.S. Cl. ........................................ 333/195; 333/193
(58) Field of Classification Search .................. 333/133, 333/193–196; 310/313 B
See application file for complete search history.

(56) References Cited

U.S. PATENT DOCUMENTS

| 6,420,946 | B1 | 7/2002 | Bauer et al. | |
|---|---|---|---|---|
| 2004/0222870 | A1 | 11/2004 | Ueda et al. | |
| 2006/0208834 | A1* | 9/2006 | Takamine | 333/195 |
| 2007/0229194 | A1 | 10/2007 | Takamine | |
| 2008/0122552 | A1 | 5/2008 | Ouchi | |
| 2010/0259341 | A1* | 10/2010 | Nakai | 333/193 |

FOREIGN PATENT DOCUMENTS

| JP | 04-054011 A | | 2/1992 |
|---|---|---|---|
| JP | 2002-528987 A | | 9/2002 |
| JP | 2003-243965 A | | 8/2003 |
| JP | 2006-254410 A | | 9/2006 |
| JP | 2008-35092 | * | 2/2008 |
| WO | 2006/068086 A1 | | 6/2006 |
| WO | 2007/083503 A1 | | 7/2007 |
| WO | WO 2009/001651 | * | 12/2008 |

OTHER PUBLICATIONS

Official Communication issued in International Patent Application No. PCT/JP20091003950, mailed on Sep. 29, 2009.
Takamine, "Elastic Wave Filter Device", U.S. Appl. No. 13/045,587, filed on Mar. 11, 2011.

* cited by examiner

*Primary Examiner* — Barbara Summons
(74) *Attorney, Agent, or Firm* — Keating & Bennett, LLP

(57) ABSTRACT

A 5-IDT longitudinally coupled resonator type elastic wave filter device includes a narrow-pitch electrode finger portion arranged to increase the steepness of the filter characteristic includes first to fifth IDTs. When the total number of electrode fingers in a first area and a fourth area is Nx and the total number of electrode fingers in a second area and a third area is Ny, an average period of electrode fingers in one of the areas including larger total numbers of the electrode fingers Nx and Ny is greater than that in the area including smaller total numbers of the electrode fingers Nx and Ny. Among the first IDT electrode, the third IDT electrode, and the fifth IDT electrode, the period of electrode fingers in a portion other than the narrow-pitch electrode finger portion of the IDT electrode in the area including the larger numbers of electrode fingers is less than the period of electrode fingers in a portion other than the narrow-pitch electrode finger portion of the IDT electrode in the area including the smaller numbers of electrode fingers.

13 Claims, 14 Drawing Sheets

ELASTIC WAVE FILTER DEVICE HAVING NARROW-PITCH ELECTRODE FINGER PORTIONS

BACKGROUND OF THE INVENTION

1. Field of the Invention

The present invention relates to an elastic wave filter device used as, for example, an RF stage bandpass filter of a cell phone and, in particular, to a longitudinally coupled resonator type elastic wave filter device including first to fifth IDT electrodes.

2. Description of the Related Art

It is strongly desired that passband filters have a steep filter characteristic in a range between the passband and the stopband. Japanese Unexamined Patent Application Publication No. 4-54011 describes a surface acoustic wave filter device that increases the steepness of the filter characteristic. In the surface acoustic wave filter device described in Japanese Unexamined Patent Application Publication No. 4-54011, an elastic wave resonator is connected to a 3-IDT longitudinally coupled resonator type elastic wave filter device in series or in parallel. By controlling the locations of the resonance frequency and the anti-resonance frequency of the elastic wave resonator connected in series or in parallel, the steepness of the filter characteristic in the low frequency range and the high frequency range of the passband can be increased.

However, in such a method using the frequency characteristic of an elastic wave resonator, the steepness increasing effect depends on the Q value of the elastic wave resonator. The Q value of the elastic wave resonator is primarily determined by the material of a piezoelectric substrate and the material of an electrode. Accordingly, it is difficult to further increase the steepness of the filter characteristic by increasing the Q value of the elastic wave resonator.

On the other hand, WO2006/068086A1 describes a 5-IDT longitudinally coupled resonator type surface acoustic wave filter device having a balanced-unbalanced conversion function. FIG. 26 is a schematic plan view of the surface acoustic wave filter device described in WO2006/068086A1. A surface acoustic wave filter device 1001 includes a piezoelectric substrate 1002. As shown in FIG. 26, an electrode structure is provided on the piezoelectric substrate 1002. The electrode structure is connected between an unbalanced terminal 1003 and each of a first balanced terminal 1004 and a second balanced terminal 1005. A 5-IDT longitudinally coupled resonator type elastic wave filter portion 1010 is connected to the unbalanced terminal 1003. The 5-IDT longitudinally coupled resonator type elastic wave filter portion 1010 includes first to fifth IDT electrodes 1011 to 1015 and reflectors 1016 and 1017. In this example, the first to fifth IDT electrodes 1011 to 1015 include, on the end adjacent to a different IDT electrode, a narrow-pitch electrode finger portion N1011, a pair of electrode finger portions N1012a and N1012b, a pair of narrow-pitch electrode finger portions N1013a and N1013b, a pair of narrow-pitch electrode finger portions N1014a and N1014b, and a narrow-pitch electrode finger portion N1015, respectively.

In addition, surface acoustic wave resonators 1021 and 1022 are connected downstream of the 5-IDT longitudinally coupled resonator type elastic wave filter portion 1010.

In this example, in the narrow-pitch electrode finger portion N1011 of the first IDT electrode 1011 connected to the first balanced terminal 1004 and the narrow-pitch electrode finger portion N1015 of the fifth IDT electrode 1015 connected to the second balanced terminal 1005 and in narrow-pitch electrode finger portions N1013a and N1013b of the third IDT electrode 1013, the electrode finger pitch of the narrow-pitch electrode finger portion on the side at which the number of electrode fingers of the narrow-pitch electrode finger portion is greater, is greater than that on the side at which the number of electrode fingers of the narrow-pitch electrode finger portion is fewer. In this manner, a ripple is reduced in the passband. However, in such a structure, the steepness of the filter characteristic cannot be sufficiently increased.

In addition, WO2007/083503A1 describes a 5-IDT longitudinally coupled resonator type elastic wave filter device which does not include any narrow-pitch electrode finger portions. In this example, the number of electrode fingers and the pitch of the electrode fingers of an IDT electrode located in the middle are less than the number of electrode fingers and the pitch of the electrode fingers of an IDT electrode located on either side of the IDT electrode located in the middle. In this manner, the attenuation in the stopband adjacent to the low frequency range of the passband is increased and, therefore, the steepness of the filter characteristic is increased.

As noted above, the surface acoustic wave filter device described in Japanese Unexamined Patent Application Publication No. 4-54011 is limited in the amount that the steepness of the filter characteristic can be increased. Accordingly, the elastic wave filter device cannot provide a sufficiently increased steepness of the filter characteristic that has been required in recent years.

In contrast, the longitudinally coupled resonator type surface acoustic wave filter device described in WO2006/068086A1 only reduces a ripple that occurs in the passband by controlling the electrode finger pitch and the number of the electrode fingers in the narrow-pitch electrode finger portion in the above-described manner. In WO2006/068086A1, the structure that increases the steepness of the filter characteristic is not described.

In WO2007/083503A1, the longitudinally coupled resonator type surface acoustic wave filter device including no narrow-pitch electrode finger portions increases the steepness of the filter characteristic by controlling the number of electrode fingers and the electrode finger pitch of the IDT electrode located in the middle and the number of electrode fingers and the electrode finger pitch of an IDT electrode located on either side of the IDT electrode located in the middle. However, the steepness of the filter characteristic is still not sufficiently high and, therefore, there is a demand for the steepness to be further increased.

SUMMARY OF THE INVENTION

To overcome the problems described above, preferred embodiments of the present invention provide a 5-IDT longitudinally coupled resonator type elastic wave filter device including a narrow-pitch electrode finger portion that significantly increases the steepness of the filter characteristic.

According to a preferred embodiment of the present invention, an elastic wave filter device preferably includes a piezoelectric substrate, first to fifth IDT electrodes sequentially arranged on the piezoelectric substrate in a direction in which elastic waves propagate, and first and second reflectors disposed on either side of an area in which the first to fifth IDT electrodes are disposed in the direction in which elastic waves propagate. The first to fifth IDT electrodes and the first and second reflectors define a longitudinally coupled resonator type elastic wave filter portion. Each of the first to fifth IDT electrodes preferably includes a narrow-pitch electrode finger portion in which the period of electrode fingers is less than that in the other portion at an end adjacent to a different IDT electrode. Along the direction in which elastic waves propagate, an area including the first IDT electrode and a half of the second IDT electrode neighboring the first IDT electrode is defined as a first area, an area including a half of the second IDT electrode neighboring the third IDT electrode and a half of the third IDT electrode neighboring the second IDT electrode is defined as a second area, an area including a half of the third IDT electrode neighboring the fourth IDT electrode and a half of the fourth IDT electrode neighboring the third IDT electrode is defined as a third area, and an area including a half of the fourth IDT electrode neighboring the fifth IDT electrode and the fifth IDT electrode is defined as a fourth area. According to a preferred embodiment of the present invention, when each of the total numbers of electrode fingers in the narrow-pitch electrode finger portions in the first area and in the fourth area is Nx and each of the total numbers of electrode fingers in the narrow-pitch electrode finger portions in the second area and in the third area is Ny, the number of electrode fingers Nx is preferably different from the number of electrode fingers Ny. An average period of electrode fingers in the narrow-pitch electrode finger portion located in the area having a greater of the numbers of electrode fingers Nx and Ny is preferably greater than an average period of electrode fingers in the narrow-pitch electrode finger portion located in the area having a lesser of the numbers of electrode fingers Nx and Ny. Among the first, third, and fifth IDT electrodes, the period of electrode fingers in a portion other than the narrow-pitch electrode finger portion of the IDT electrode included in the area having a greater number of electrode fingers is preferably less than that included in the area having a lesser number of electrode fingers.

According to a preferred embodiment of the elastic wave filter device according to the present invention, the total number of electrode fingers in the narrow-pitch electrode finger portions included in the first area is preferably less than the total number of electrode fingers in the narrow-pitch electrode finger portions included in the second area, and the total number of electrode fingers in the narrow-pitch electrode finger portions included in the third area is preferably greater than the total number of electrode fingers in the narrow-pitch electrode finger portions in the fourth area.

According to another preferred embodiment of the present invention, the number of electrode fingers in the narrow-pitch electrode finger portion of the second IDT electrode included in the first area is preferably less than the number of electrode fingers in the narrow-pitch electrode finger portion of the second IDT electrode included in the second area. The number of electrode fingers in the narrow-pitch electrode finger portion of the fourth IDT electrode included in the third area is preferably greater than the number of electrode fingers in the narrow-pitch electrode finger portion of the fourth IDT electrode included in the fourth area. A period of electrode fingers in the narrow-pitch electrode finger portion of the second IDT electrode included in the first area is preferably less than a period of electrode fingers in the narrow-pitch electrode finger portion of the second IDT electrode included in the second area. A period of electrode fingers in the narrow-pitch electrode finger portion of the fourth IDT electrode included in the third area is preferably greater than a period of electrode fingers in the narrow-pitch electrode finger portion of the fourth IDT electrode included in the fourth area, and a period of electrode fingers in a portion other than the narrow-pitch electrode finger portions of the third IDT electrode is preferably less than a period of electrode fingers in a portion other than the narrow-pitch electrode finger portions of each of the first IDT electrode and the fifth IDT electrode.

According to another preferred embodiment of the present invention, the number of electrode fingers in the narrow-pitch electrode finger portion of the second IDT electrode included in the first area is preferably less than the number of electrode fingers in the narrow-pitch electrode finger portion of the second IDT electrode included in the second area. The number of electrode fingers in the narrow-pitch electrode finger portion of the fourth IDT electrode included in the third area is preferably greater than the number of electrode fingers in the narrow-pitch electrode finger portion of the fourth IDT electrode included in the fourth area. A period of electrode fingers in the narrow-pitch electrode finger portion of the first IDT electrode included in the first area is preferably less than the period of electrode fingers in the narrow-pitch electrode finger portion of the third IDT electrode included in the second area. A period of electrode fingers in the narrow-pitch electrode finger portion of the third IDT electrode included in the third area is preferably greater than a period of electrode fingers in the narrow-pitch electrode finger portion of the fifth IDT electrode included in the fourth area, and a period of electrode fingers in a portion other than the narrow-pitch electrode finger portions of the third IDT electrode is preferably less than a period of electrode fingers in a portion other than the narrow-pitch electrode finger portions of each of the first IDT electrode and the fifth IDT electrode.

According to still another preferred embodiment of the present invention, the number of electrode fingers in the narrow-pitch electrode finger portion of the first IDT electrode included in the first area is preferably less than the number of electrode fingers in the narrow-pitch electrode finger portion of the third IDT electrode included in the second area. The number of electrode fingers in the narrow-pitch electrode finger portion of the third IDT electrode included in the third area is preferably greater than the number of electrode fingers in the narrow-pitch electrode finger portion of the fifth IDT electrode included in the fourth area. A period of electrode fingers in the narrow-pitch electrode finger portion of the second IDT electrode included in the first area is preferably less than a period of electrode fingers in the narrow-pitch electrode finger portion of the second IDT electrode included in the second area. A period of electrode fingers in the narrow-pitch electrode finger portion of the fourth IDT electrode included in the third area is preferably greater than a period of electrode fingers in the narrow-pitch electrode finger portion of the fourth IDT electrode included in the fourth area, and a period of electrode fingers in a portion other than the narrow-pitch electrode finger portions of the third IDT electrode is preferably less than a period of electrode fingers in a portion other than the narrow-pitch electrode finger portions of each of the first IDT electrode and the fifth IDT electrode.

According to still another preferred embodiment of the present invention, the number of electrode fingers in the narrow-pitch electrode finger portion of the first IDT electrode included in the first area is preferably less than the number of electrode fingers in the narrow-pitch electrode finger portion of the third IDT electrode included in the second area. The number of electrode fingers in the narrow-pitch electrode finger portion of the third IDT electrode included in the third area is preferably greater than the number of electrode fingers in the narrow-pitch electrode finger portion of the fifth IDT electrode included in the fourth area. A period of electrode fingers in the narrow-pitch electrode finger portion of the first IDT electrode included in the first area is preferably less than the period of electrode fingers in the narrow-pitch electrode finger portion of the third IDT electrode included in the second area. A period of electrode fingers in the narrow-pitch electrode finger portion of the third IDT electrode included in the third area is preferably greater than a period of electrode fingers of the fifth IDT electrode included in the fourth area, and a period of electrode fingers in a portion other than the narrow-pitch electrode finger portions of the third IDT electrode is preferably less than a period of electrode fingers in a portion other than the narrow-pitch electrode finger portions of each of the first IDT electrode and the fifth IDT electrode.

According to still another preferred embodiment of the present invention, the number of electrode fingers in the narrow-pitch electrode finger portion of the first IDT electrode included in the first area is preferably less than the number of electrode fingers in the narrow-pitch electrode finger portion of the third IDT electrode included in the second area. The number of electrode fingers in the narrow-pitch electrode finger portion of the second IDT electrode included in the first area is preferably less than the number of electrode fingers in the narrow-pitch electrode finger portion of the second IDT electrode included in the second area. The number of electrode fingers in the narrow-pitch electrode finger portion of the fourth IDT electrode included in the third area is preferably greater than the number of electrode fingers in the narrow-pitch electrode finger portion of the fourth IDT electrode included in the fourth area. The number of electrode fingers in the narrow-pitch electrode finger portion of the third IDT electrode included in the third area is preferably greater than the number of electrode fingers in the narrow-pitch electrode finger portion of the fifth IDT electrode included in the fourth area. A period of electrode fingers in the narrow-pitch electrode finger portion of the first IDT electrode included in the first area is preferably less than a period of electrode fingers in the narrow-pitch electrode finger portion of the third IDT electrode included in the second area. A period of electrode fingers in the narrow-pitch electrode finger portion of the second IDT electrode included in the first area is preferably less than a period of electrode fingers in the narrow-pitch electrode finger portion of the second IDT electrode included in the second area. A period of electrode fingers in the narrow-pitch electrode finger portion of the fourth IDT electrode included in the third area is preferably greater than a period of electrode fingers in the narrow-pitch electrode finger portion of the fourth IDT electrode included in the fourth area. A period of electrode fingers in the narrow-pitch electrode finger portion of the third IDT electrode included in the third area is preferably greater than a period of electrode fingers in the narrow-pitch electrode finger portion of the fifth IDT electrode included in the fourth area, and a period of electrode fingers in a portion other than the narrow-pitch electrode finger portions of the third IDT electrode is preferably less than a period of electrode fingers in a portion other than the narrow-pitch electrode finger portions of each of the first IDT electrode and the fifth IDT electrode.

According to another preferred embodiment of the present invention, the total number of electrode fingers in the narrow-pitch electrode finger portions included in the first area is preferably greater than the total number of electrode fingers in the narrow-pitch electrode finger portions included in the second area, and the total number of electrode fingers in the narrow-pitch electrode finger portions included in the third area is preferably less than the total number of electrode fingers in the narrow-pitch electrode finger portions included in the fourth area.

According to another preferred embodiment of the present invention, the number of electrode fingers in the narrow-pitch electrode finger portion of the second IDT electrode included in the first area is preferably greater than the number of electrode fingers in the narrow-pitch electrode finger portion of the second IDT electrode included in the second area. The number of electrode fingers in the narrow-pitch electrode finger portion of the fourth IDT electrode included in the third area is preferably less than the number of electrode fingers in the narrow-pitch electrode finger portion of the fourth IDT electrode included in the fourth area. A period of electrode fingers in the narrow-pitch electrode finger portion of the second IDT electrode included in the first area is preferably greater than a period of electrode fingers in the narrow-pitch electrode finger portion of the second IDT electrode included in the second area. A period of electrode fingers in the narrow-pitch electrode finger portion of the fourth IDT electrode included in the third area is preferably less than a period of electrode fingers in the narrow-pitch electrode finger portion of the fourth IDT electrode included in the fourth area, and a period of electrode fingers in a portion other than the narrow-pitch electrode finger portions of the third IDT electrode is preferably greater than the period of electrode fingers in a portion other than the narrow-pitch electrode finger portions of each of the first IDT electrode and the fifth IDT electrode.

According to still another preferred embodiment of the present invention, the number of electrode fingers in the narrow-pitch electrode finger portion of the second IDT electrode included in the first area is preferably greater than the number of electrode fingers in the narrow-pitch electrode finger portion of the second IDT electrode included in the second area. The number of electrode fingers in the narrow-pitch electrode finger portion of the fourth IDT electrode included in the third area is preferably less than the number of electrode fingers in the narrow-pitch electrode finger portion of the fourth IDT electrode included in the fourth area. A period of electrode fingers in the narrow-pitch electrode finger portion of the first IDT electrode included in the first area is preferably greater than a period of electrode fingers in the narrow-pitch electrode finger portion of the third IDT electrode included in the second area. A period of electrode fingers in the narrow-pitch electrode finger portion of the third IDT electrode included in the third area is preferably less than a period of electrode fingers in the narrow-pitch electrode finger portion of the fifth IDT electrode included in the fourth area, and a period of electrode fingers in a portion other than the narrow-pitch electrode finger portions of the third IDT electrode is preferably greater than a period of electrode fingers in a portion other than the narrow-pitch electrode finger portions of each of the first IDT electrode and the fifth IDT electrode.

According to still another preferred embodiment of the present invention, the number of electrode fingers in the narrow-pitch electrode finger portion of the first IDT electrode included in the first area is preferably greater than the number of electrode fingers in the narrow-pitch electrode finger portion of the third IDT electrode included in the second area. The number of electrode fingers in the narrow-pitch electrode finger portion of the third IDT electrode included in the third area is preferably less than the number of electrode fingers in the narrow-pitch electrode finger portion of the fifth IDT electrode included in the fourth area. A period of electrode fingers in the narrow-pitch electrode finger portion of the second IDT electrode included in the first area is preferably greater than the period of electrode fingers in the narrow-pitch electrode finger portion of the second IDT electrode included in the second area. A period of electrode fingers in the narrow-pitch electrode finger portion of the fourth IDT electrode included in the third area is preferably less than a period of electrode fingers in the narrow-pitch electrode finger portion of the fourth IDT electrode included in the fourth area, and a period of electrode fingers in a portion other than the narrow-pitch electrode finger portions of the third IDT electrode is preferably greater than a period of electrode fingers in a portion other than the narrow-pitch electrode finger portions of each of the first IDT electrode and the fifth IDT electrode.

According to still another preferred embodiment of the present invention, the number of electrode fingers in the narrow-pitch electrode finger portion of the first IDT electrode included in the first area is preferably greater than the number of electrode fingers in the narrow-pitch electrode finger portion of the third IDT electrode included in the second area. The number of electrode fingers in the narrow-pitch electrode finger portion of the third IDT electrode included in the third area is preferably less than the number of electrode fingers in the narrow-pitch electrode finger portion of the fifth IDT electrode included in the fourth area. A period of electrode fingers in the narrow-pitch electrode finger portion of the first IDT electrode included in the first area is preferably greater than a period of electrode fingers in the narrow-pitch electrode finger portion of the third IDT electrode in the second area. A period of electrode fingers in the narrow-pitch electrode finger portion of the third IDT electrode included in the third area is preferably less than a period of electrode fingers in the narrow-pitch electrode finger portion of the fifth IDT electrode included in the fourth area, and the period of electrode fingers in a portion other than the narrow-pitch electrode finger portions of the third IDT electrode is preferably greater than the period of electrode fingers in a portion other than the narrow-pitch electrode finger portions of each of the first IDT electrode and the fifth IDT electrode.

According to still another preferred embodiment of the present invention, the number of electrode fingers in the narrow-pitch electrode finger portion of the first IDT electrode included in the first area is preferably greater than the number of electrode fingers in the narrow-pitch electrode finger portion of the third IDT electrode included in the second area. The number of electrode fingers in the narrow-pitch electrode finger portion of the second IDT electrode included in the first area is preferably greater than the number of electrode fingers in the narrow-pitch electrode finger portion of the second IDT electrode included in the second area. The number of electrode fingers in the narrow-pitch electrode finger portion of the fourth IDT electrode included in the third area is preferably less than the number of electrode fingers in the narrow-pitch electrode finger portion of the fourth IDT electrode included in the fourth area. The number of electrode fingers in the narrow-pitch electrode finger portion of the third IDT electrode included in the third area is preferably less than the number of electrode fingers in the narrow-pitch electrode finger portion of the fifth IDT electrode included in the fourth area. A period of electrode fingers in the narrow-pitch electrode finger portion of the first IDT electrode included in the first area is preferably greater than the period of electrode fingers in the narrow-pitch electrode finger portion of the third IDT electrode included in the second area. A period of electrode fingers in the narrow-pitch electrode finger portion of the second IDT electrode included in the first area is preferably greater than a period of electrode fingers in the narrow-pitch electrode finger portion of the second IDT electrode included in the second area. A period of electrode fingers in the narrow-pitch electrode finger portion of the fourth IDT electrode included in the third area is preferably less than the period of electrode fingers in the narrow-pitch electrode finger portion of the fourth IDT electrode included in the fourth area. A period of electrode fingers in the narrow-pitch electrode finger portion of the third IDT electrode included in the third area is preferably less than a period of electrode fingers in the narrow-pitch electrode finger portion of the fifth IDT electrode included in the fourth area, and a period of electrode fingers in a portion other than the narrow-pitch electrode finger portions of the third IDT electrode is preferably greater than a period of electrode fingers in a portion other than the narrow-pitch electrode finger portions of each of the first IDT electrode and the fifth IDT electrode.

According to various preferred embodiments of the present invention, in the 5-IDT longitudinally coupled resonator type elastic wave filter device including first to fifth IDT electrodes, since the total number of electrode fingers Nx is preferably different from the total number of electrode fingers Ny, the steepness of the filter characteristics in the low frequency range of the passband is effectively increased.

In addition, since the average period of electrode fingers in the narrow-pitch electrode finger portion in an area including the larger total number of electrode fingers Nx and Ny is preferably greater than that in an area including the smaller total numbers of electrode fingers Nx and Ny, a spike ripple appearing in the passband is significantly reduced or prevented.

Furthermore, among the first, third, and fifth IDT electrodes, the period of electrode fingers in a portion other than the narrow-pitch electrode finger portion of the IDT electrode in the area including the larger number of electrode fingers is preferably less than the period of electrode fingers in a portion other than the narrow-pitch electrode finger portion of the IDT electrode in the area including the smaller number of electrode fingers. Accordingly, the steepness of the filter characteristic in the low frequency range of the passband is more effectively increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention are described below with reference to the drawings.

First Preferred Embodiment

Figure 1:
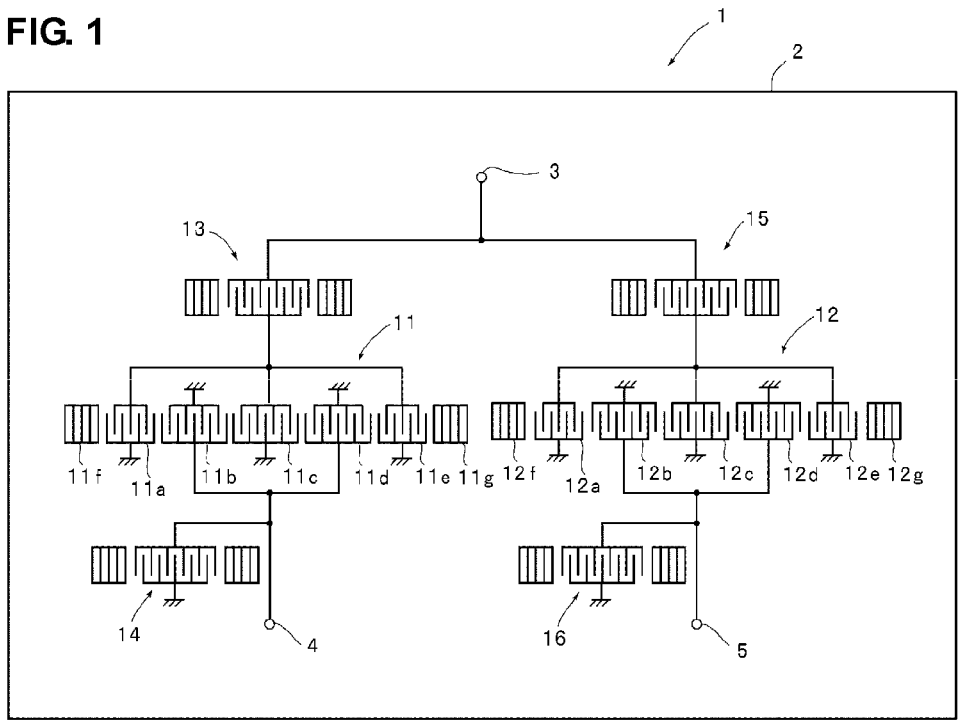
FIG. 1 is a schematic plan view of an elastic wave filter device according to a first preferred embodiment of the present invention.

FIG. 1 is a schematic plan view of an elastic wave filter device according to a first preferred embodiment of the present invention. According to the first preferred embodiment, an elastic wave filter device 1 includes a piezoelectric substrate 2. As shown in FIG. 1, an electrode structure is provided on the piezoelectric substrate 2. In this manner, a surface acoustic wave filter device having a balanced-unbalanced conversion function is provided.

The elastic wave filter device 1 according to the first preferred embodiment can preferably be used as a receiving filter of the UMTS-Band 2 of a cell phone, for example. The transmitting frequency of the UMTS-Band 2 ranges from about 1.850 GHz to about 1.910 GHz, while the receiving frequency of the UMTS-Band 2 ranges from about 1.930 GHz to about 1.990 GHz.

The elastic wave filter device 1 preferably includes an unbalanced terminal 3 and first and second balanced terminals 4 and 5. The impedance on the side of the unbalanced terminal 3 is preferably about 50Ω, and the impedance on the side of the first and second balanced terminals 4 and 5 is preferably about 100Ω, for example. That is, the elastic wave filter device 1 has an impedance conversion function in addition to the balanced-unbalanced conversion function.

The piezoelectric substrate 2 is preferably made of an appropriate piezoelectric single crystal or a piezoelectric ceramic, for example. According to the first preferred embodiment, the piezoelectric substrate 2 is preferably made from a 40°±5° Y-cut X-propagating $LiTaO_3$ substrate, for example.

According to the first preferred embodiment, the electrode structure provided on the piezoelectric substrate 2 is preferably made of Al, for example. However, the electrode structure may be made of a metal, such as Au, Cu, Pt, W, or Ta, or an alloy, for example. In addition, the electrode structure may be formed from a single metal film or a laminated metal film including a plurality of stacked metal films.

A first longitudinally coupled resonator type elastic wave filter portion 11 is preferably connected between the unbalanced terminal 3 and the first balanced terminal 4. In addition, a second 5-IDT longitudinally coupled resonator type elastic wave filter portion 12 is preferably connected between the unbalanced terminal 3 and the second balanced terminal 5.

An elastic wave resonator 13 is preferably connected in series to the first longitudinally coupled resonator type elastic wave filter portion 11 between the first longitudinally coupled resonator type elastic wave filter portion 11 and the unbalanced terminal 3. The elastic wave resonator 13 functions as a series trap.

An elastic wave resonator 14 is preferably connected between the ground potential and a connection point between the output side of the first longitudinally coupled resonator type elastic wave filter portion 11 and the first balanced terminal 4. The elastic wave resonator 14 functions as a shunt trap.

An elastic wave resonator 15 is preferably connected in series to the second longitudinally coupled resonator type elastic wave filter portion 12 between the second longitudinally coupled resonator type elastic wave filter portion 12 and the unbalanced terminal 3. The elastic wave resonator 15 functions as a series trap.

An elastic wave resonator 16 is preferably connected between the ground potential and a connection point between the output side of the second longitudinally coupled resonator type elastic wave filter portion 12 and the second balanced terminal 5. The elastic wave resonator 16 functions as a shunt trap.

The first longitudinally coupled resonator type elastic wave filter portion 11 preferably includes first to fifth IDT electrodes 11a to 11e, which are arranged in this order in a direction in which the elastic waves propagate. A first reflector 11f and a second reflector 11g are arranged at either end of an area in which the IDT electrodes 11a to 11e are arranged in the direction in which the elastic waves propagate.

Similar to the first longitudinally coupled resonator type elastic wave filter portion 11, the second longitudinally coupled resonator type elastic wave filter portion 12 preferably includes first to fifth IDT electrodes 12a to 12e and a first reflector 12f and a second reflector 12g. However, the first to fifth IDT electrodes 11a to 11e and the first to fifth IDT electrodes 12a to 12e are preferably arranged so that the phase of a signal output from the first balanced terminal 4 is different from the phase of a signal output from the second balanced terminal 5 by 180 degrees. More specifically, the phase of the second IDT electrode 12b and the fourth IDT electrode 12d is preferably the inverse of the phase of the second IDT electrode 11b and the fourth IDT electrode 11d. Thus, the phase of a signal output from the first balanced terminal 4 is different from the phase of a signal output from the second balanced terminal 5 by 180 degrees.

In the first longitudinally coupled resonator type elastic wave filter portion 11, preferably, one end of the first IDT electrode 11a, one end of the third IDT electrode 11c, and one end of the fifth IDT electrode 11e are commonly connected and are connected to the unbalanced terminal 3 via the elastic wave resonator 13. The other end of the first IDT electrode 11a, the other end of the third IDT electrode 11c, and the other end of the fifth IDT electrode 11e are preferably connected to the ground potential.

One end of the second IDT electrode 11b and one end of the fourth IDT electrode 11d are preferably connected to the ground potential. The other end of the second IDT electrode 11b and the other end of the fourth IDT electrode 11d are preferably commonly connected and are connected to the first balanced terminal 4.

The second longitudinally coupled resonator type elastic wave filter portion 12 has a similar structure as the first longitudinally coupled resonator type elastic wave filter portion 11. Preferably, one end of the first IDT electrode 12a, one end of the third IDT electrode 12c, and one end of the fifth IDT electrode 12e are commonly connected and are connected to the unbalanced terminal 3 via the elastic wave resonator 15. The other end of the first IDT electrode 12a, the other end of the third IDT electrode 12c, and the other end of the fifth IDT electrode 12e are preferably connected to the ground potential.

One end of the second IDT electrode 12b and one end of the fourth IDT electrode 12d are preferably connected to the ground potential. The other end of the second IDT electrode 12b and the other end of the fourth IDT electrode 12d are preferably commonly connected and are connected to the second balanced terminal 5.

Each of the elastic wave resonators 13 to 16 is preferably a one-port elastic wave resonator, for example. Each of the elastic wave resonators 13 to 16 preferably includes an IDT electrode and first and second reflectors disposed on either side of the IDT electrode in a direction in which the elastic waves propagate.

The elastic wave resonators 13 to 16 are provided in order to increase the attenuation outside the passband. More specifically, preferably, the resonant frequency of the elastic wave resonators 13 and 15 is located in the passband of the elastic wave filter device 1, while the anti-resonant frequency is located in the attenuation range in the vicinity of the end of the high frequency range of the passband. Thus, the attenuation in the attenuation range located in the frequency range above the passband is increased.

In contrast, preferably, the resonant frequency of the elastic wave resonators 14 and 16 is located in the attenuation range in the vicinity of the end of the low frequency range of the passband, while the anti-resonant frequency is located in the passband. Thus, the attenuation in the attenuation range located in the frequency range below the passband is increased.

According to the first preferred embodiment, the elastic wave filter device 1 preferably includes the structure of the first to fifth IDT electrodes 11a to 11e of the first longitudinally coupled resonator type elastic wave filter portion 11 and the first to fifth IDT electrodes 12a to 12e of the second longitudinally coupled resonator type elastic wave filter portion 12. The structure is described below with reference to FIGS. 2 to 9.

In FIG. 1, the electrode finger pitches of the first to fifth IDT electrodes 11a to 11e of the first longitudinally coupled resonator type elastic wave filter portion 11 and the first to fifth IDT electrodes 12a to 12e of the second longitudinally coupled resonator type elastic wave filter portion 12 are preferably the same or substantially the same. However, in actuality, the first longitudinally coupled resonator type elastic wave filter portion 11 of the elastic wave filter device according to the first preferred embodiment preferably has a structure as shown in FIG. 3.

Figure 2:
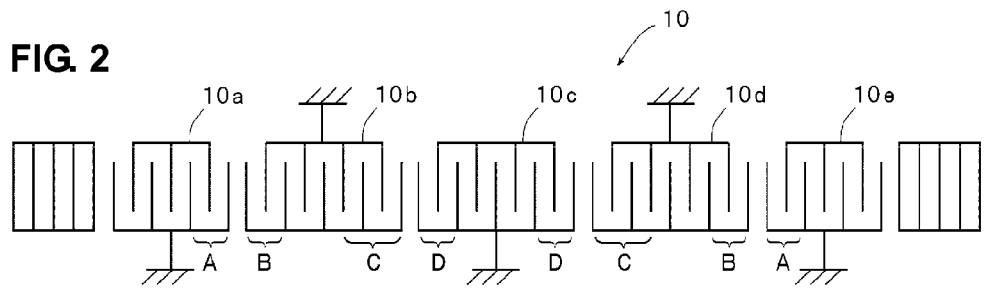
FIG. 2 is a schematic illustration of the structure of a 5-IDT longitudinally coupled resonator type elastic wave filter portion for identifying the positions of narrow-pitch electrode finger portions according a preferred embodiment of the present invention.
Figure 3:
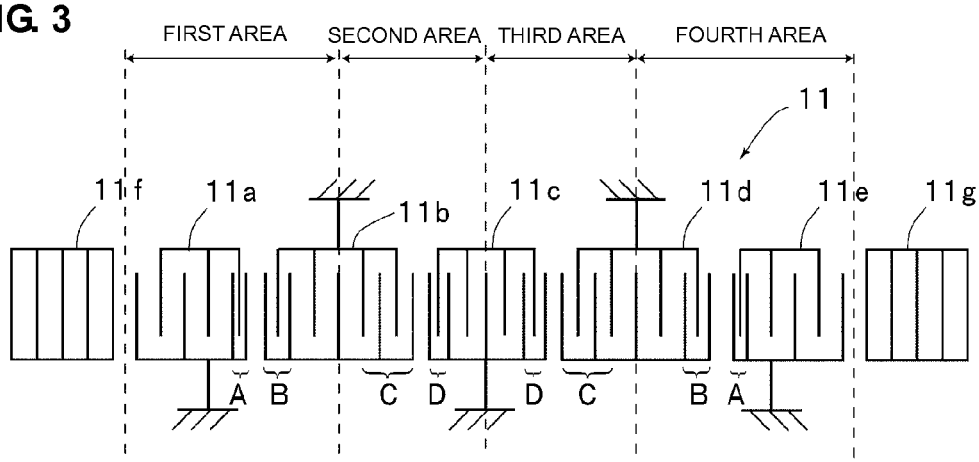
FIG. 3 is a schematic plan view of a first longitudinally coupled resonator type elastic wave filter portion according to the first preferred embodiment of the present invention.

As shown in FIG. 3, each of the first to fifth IDT electrodes 11a to 11e preferably includes a narrow-pitch electrode finger portion at end portions thereof that are adjacent to the neighboring IDT electrodes. In the narrow-pitch electrode finger portion, the electrode finger pitch is less than that in other portions. In order to describe such a structure in more detail, a virtual 5-IDT longitudinally coupled resonator type elastic wave filter portion 10 having no narrow-pitch electrode finger portion is shown in FIG. 2. The structure shown in FIG. 3 is described next with reference to the virtual 5-IDT longitudinally coupled resonator type elastic wave filter portion 10 shown in FIG. 2.

In FIG. 2, portions A to D indicate the end portions of first to fifth IDT electrodes 10a to 10e that correspond to the narrow-pitch electrode finger portions. More specifically, the portion A represents the end portion of the first IDT electrode adjacent to the second IDT electrode. Similarly, the portion A also represents the end portion of the fifth IDT electrode 10e adjacent to the fourth IDT electrode 10d. The portion B represents the outer end portion of the second IDT electrode 10b, that is, the end portion adjacent to the first IDT electrode 10a. The portion B also represents the outer end portion of the fourth IDT electrode 10d, that is, the end portion adjacent to the fifth IDT electrode 10e. The portion C represents the inner end portion of the second IDT electrode 10b, that is, the end portion adjacent to the third IDT electrode 10c. The portion C also represents the inner end portion of the fourth IDT electrode 10d, that is, the end portion adjacent to the third IDT electrode 10c. Finally, the portions D represent the end portions of the third IDT electrode 10c on either side thereof.

According to the first preferred embodiment, as shown in FIG. 3, narrow-pitch electrode finger portions are preferably provided in the portions A to D. In the following description, the narrow-pitch electrode finger portions provided in the portion A, portion B, portion C, and portion D are referred to as a narrow-pitch electrode finger portion A, a narrow-pitch electrode finger portion B, a narrow-pitch electrode finger portion C, and a narrow-pitch electrode finger portion D, respectively.

As used herein, the term "narrow-pitch electrode finger portion" refers to an electrode finger portion in which the electrode finger pitch is less than that in a portion other than the narrow-pitch electrode finger portion of an IDT electrode.

As shown in FIG. 3, the narrow-pitch electrode finger portions are preferably provided in areas at which two IDT electrodes face each other. Accordingly, each of the second IDT electrode 11b, the fourth IDT electrode 11d, and the third IDT electrode 11c that is sandwiched between other IDT electrodes preferably includes a narrow-pitch electrode finger portion on either end thereof.

Figure 4:
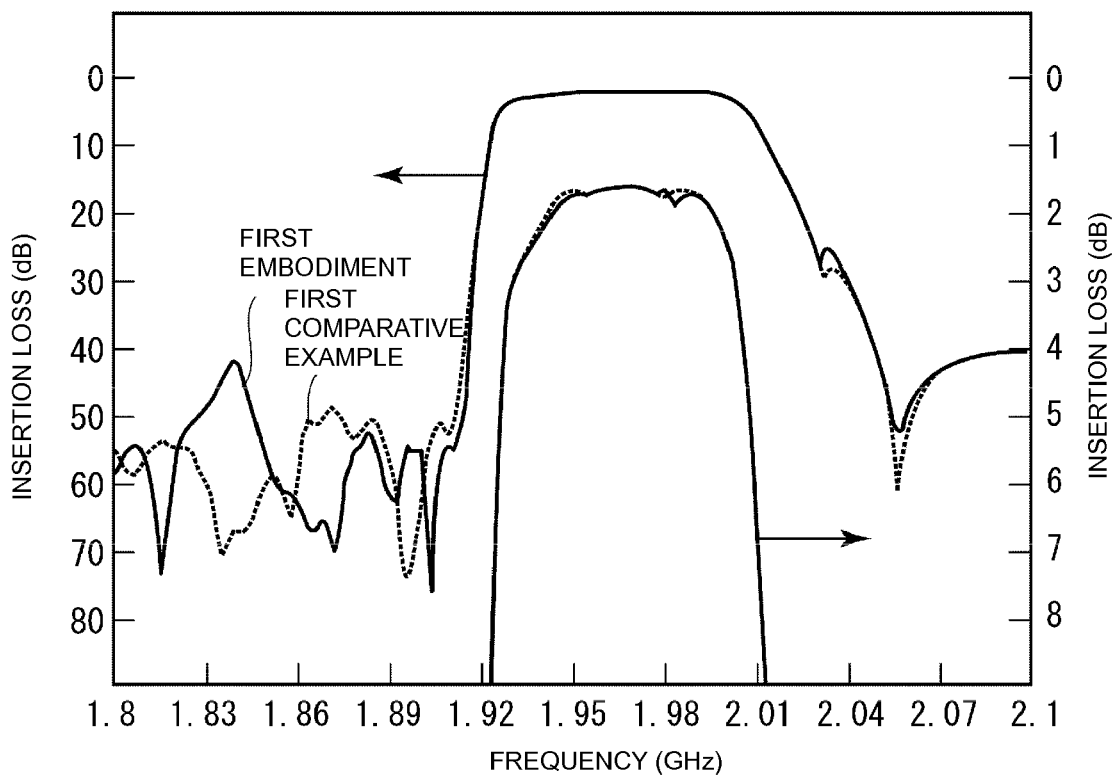
FIG. 4 illustrates the filter characteristics of an elastic wave filter device according to the first preferred embodiment of the present invention and an elastic wave filter device serving as a comparative example.

In the first preferred embodiment, in the first longitudinally coupled resonator type elastic wave filter portion 11, the number of electrode fingers in the narrow-pitch electrode finger portion of the second IDT electrode 11b adjacent to the first IDT electrode 11a and the number of electrode fingers in the narrow-pitch electrode finger portion of the fourth IDT electrode 11d adjacent to the fifth IDT electrode 11e, that is, the number of electrode fingers in each of the portions B is preferably less than the number of electrode fingers in each of the narrow-pitch electrode finger portions of the second IDT electrode 11b and the fourth IDT electrode 11d adjacent to the third IDT electrode 11c, that is, the number of electrode fingers in each of the portions C. In addition, the period of electrode fingers in the portions B is preferably less than the period of electrode fingers in the portions C. The period of electrode fingers in a portion other the narrow-pitch electrode finger portion of the third IDT electrode 11c is preferably less than the period of electrode fingers in a portion other than the narrow-pitch electrode finger portion of each of the first IDT electrode 11a and the fifth IDT electrode 11e. The second longitudinally coupled resonator type elastic wave filter portion 12 has a structure similar to that of the first longitudinally coupled resonator type elastic wave filter portion 11. With this configuration, the steepness of the filter characteristic of the elastic wave filter device 1 in the low frequency range of the passband is effectively increased. This is described below with reference to FIGS. 4 to 8. FIG. 4 illustrates the filter characteristic of the elastic wave filter device according to the first preferred embodiment. In FIG. 4, the solid line represents the result from the first preferred embodiment, and the dotted line represents the filter characteristic of an elastic wave filter device serving as a comparative example. The specifications of the electrode structures of the first preferred embodiment and the comparative example are as follows.

Specification of First Longitudinally Coupled Resonator Type Elastic Wave Filter Portion 11

Note that the wavelength determined by the pitch of the electrode fingers of the IDT electrode is denoted as "λI".

Finger cross width of electrode fingers=about 15.2λI

The first IDT electrode 11a and fifth IDT electrode 11e: The number of electrode fingers of each of the IDT electrodes is 40 (note that the number of electrode fingers in the portion A is 5 out of 40).

The third IDT electrode 11c: The number of electrode fingers is 79 (note that the portions D each including 5 electrode fingers are provided at either side thereof).

The second IDT electrode 11b and fourth IDT electrode 11d: The number of electrode fingers of each of the IDS electrodes is (note that the number of electrode fingers in the narrow-pitch electrode finger portion B is 3, the number of electrode fingers in the narrow-pitch electrode finger portion C is 7, and the number of electrode fingers in the other portion is 33).

The number of electrode fingers of each of the first reflector 11f and the second reflector 11g: 65

The metallization ratio: about 0.68

The thickness of an electrode film: about 0.091λI

In addition, the period of electrode fingers in the narrow-pitch electrode finger portion B of each of the second IDT electrode 11b and the fourth IDT electrode 11d is preferably less than that in the narrow-pitch electrode finger portion C by about 0.13 µm, for example.

The period of electrode fingers in a portion other than the narrow-pitch electrode finger portion D of the third IDT electrode 11c is preferably less than that in a portion other than the narrow-pitch electrode finger portion A of each of the first IDT electrode 11a and the fifth IDT electrode 11e by about 0.01 µm, for example.

The period of electrode fingers in the narrow-pitch electrode finger portion B is preferably less than that in the narrow-pitch electrode finger portion C by about 0.13 µm, for example.

As described above, the structure of the second longitudinally coupled resonator type elastic wave filter portion 12 is similar to that of the first longitudinally coupled resonator type elastic wave filter portion 11 except that the phase of some IDT electrodes is the inverse of the phase of the corresponding IDT electrodes.

Specifications of Elastic Wave Resonators 13 and 15

Note that the wavelength determined by the period of electrode fingers of the IDT electrode is denoted as "λll".

A finger cross width of electrode fingers: about 11.0λll
The number of electrode fingers of the IDT electrode: 71
The number of electrode fingers of each of the reflectors: 18
The metallization ratio: about 0.60
The thickness of an electrode film: about 0.095λll Specifications of Elastic Wave Resonators 14 and 16

Note that the wavelength determined by the period of electrode fingers of the IDT electrode is denoted as "λlll".

A finger cross width of electrode fingers: about 15.0λlll
The number of electrode fingers of the IDT electrode: 111
The number of electrode fingers of the reflector: 18
The metallization ratio: about 0.60
The thickness of an electrode film: about 0.091λlll Note that, as a comparative example, an elastic wave filter device having a structure similar to that of the first preferred embodiment except for the following structure is prepared:

the number of electrode fingers in each of the narrow-pitch electrode finger portion D and the narrow-pitch electrode finger portion C is 4, and the period of electrode fingers in the narrow-pitch electrode finger portion B is the same or substantially the same as the period of electrode fingers in the narrow-pitch electrode finger portion C.

As can be seen from FIG. 4, according to the first preferred embodiment, the steepness in the vicinity of the low frequency end ranging from about 1.930 GHz to about 1.990 GHz is increased as compared with the comparative example. That is, in the stopband around 1.930 GHz and, more specifically, in the frequency range from about 1.900 GHz to about 1.930 GHz, the steepness is increased. Thus, the frequency period for which the attenuation is about 3.5 dB to about 47.0 dB is decreased to a greater extent than that of the comparative example by about 2.5 MHz. If the frequency period is decreased, the tolerance for a variation in frequency caused by an assembly-to-assembly variation is increased. Furthermore, the elastic wave filter device 1 having small degradation of the insertion loss and the attenuation even when the ambient temperature varies can be provided.

As noted above, according to the first preferred embodiment, the steepness of the filter characteristic in the vicinity of the lower frequency range of the passband can be increased by setting the number of electrode fingers and the period of electrode fingers in the narrow-pitch electrode finger portion B to be less than those of the narrow-pitch electrode finger portion C. The reason for this is described next.

Figure 5:
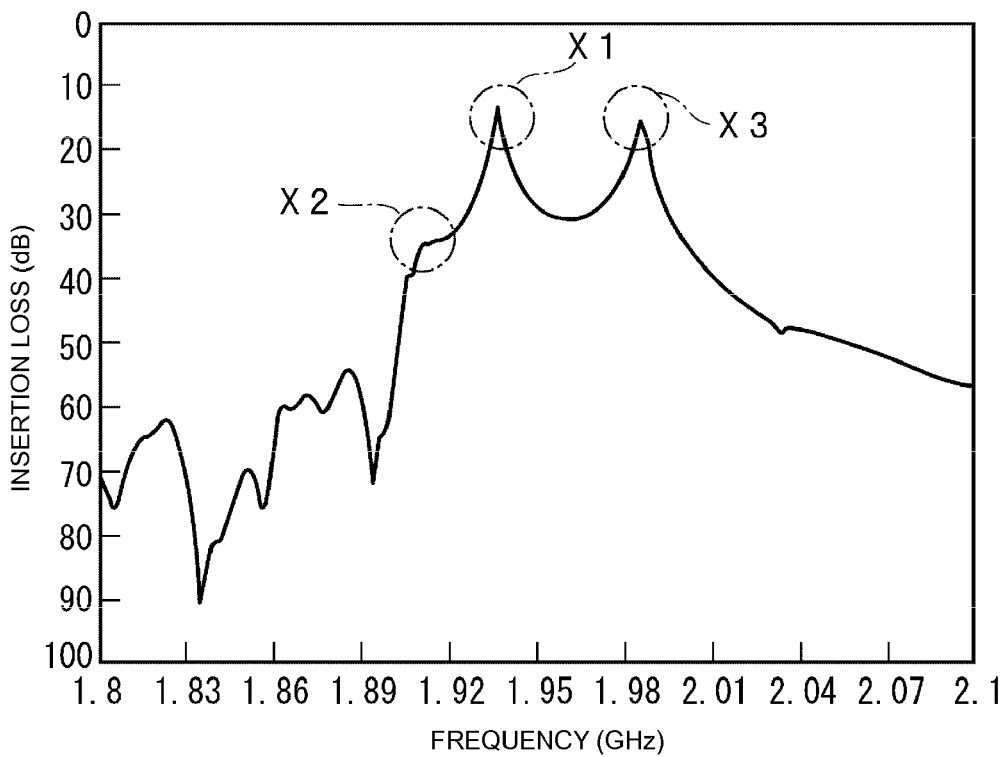
FIG. 5 illustrates the resonance points in the 0th-order mode, the second-order mode, and the inter-IDT electrode mode of the 5-IDT longitudinally coupled resonator type elastic wave filter portion.

FIG. 5 illustrates the electrical characteristics of only the first longitudinally coupled resonator type elastic wave filter portion of the elastic wave filter device 1 of the comparative example. In FIG. 5, the resonance point in a resonant mode is shown when the first longitudinally coupled resonator type elastic wave filter portion is terminated at 1Ω, and the characteristic impedance is removed. In FIG. 5, X1 represents an area in which the resonance characteristic in a 0th-order mode appears. X2 represents an area in which the resonance characteristic in a second-order mode appears. X3 represents an area of a resonance mode in which the resonance characteristic in a resonant mode having a peak of the energy distribution of the elastic waves between IDT electrodes appears, that is, an area of an inter-IDT electrode mode. The resonance point of the second-order mode is located outside the passband and, therefore, does not contribute for the formation of the passband. That is, in the above-described 5-IDT longitudinally coupled resonator type elastic wave filter portion, the passband is defined by the resonance point of the 0th-order mode and the resonance point of the inter-IDT electrode mode.

Figure 6:
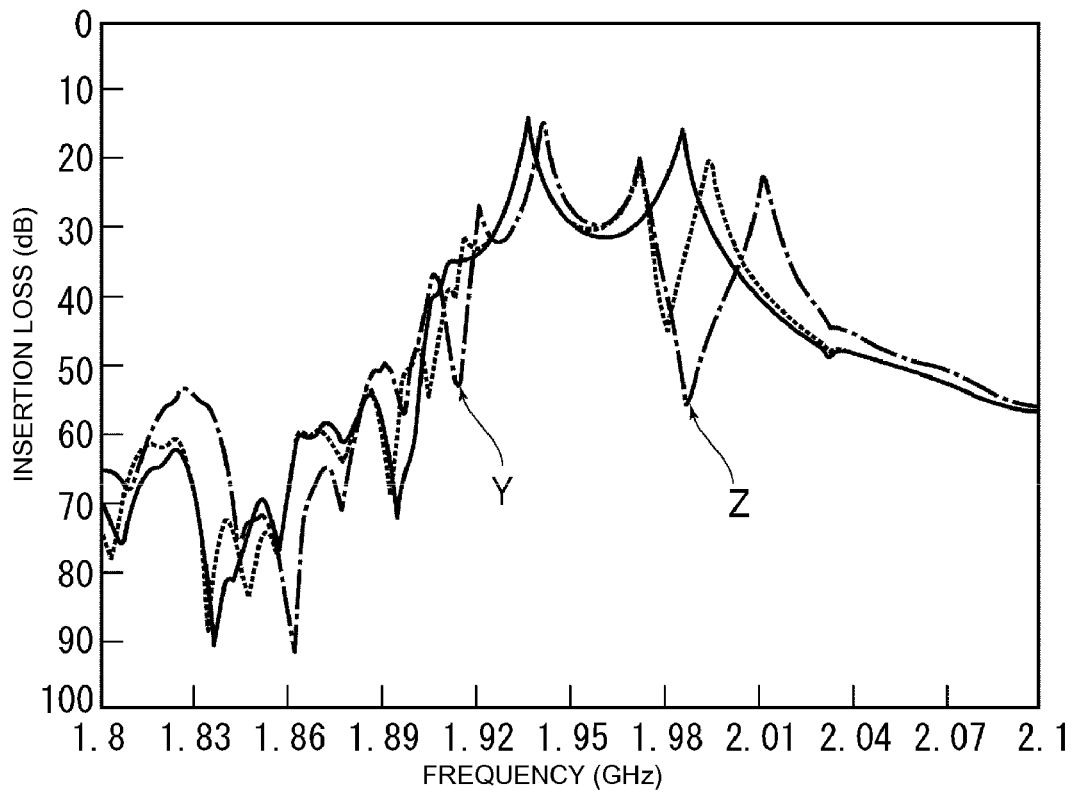
FIG. 6 illustrates a change in ripple Y and a change in ripple Z when the number of electrode fingers in a narrow-pitch electrode finger portion B is different from the number of electrode fingers in a narrow-pitch electrode finger portion C according to the first preferred embodiment of the present invention.

FIG. 6 illustrates a change in the resonant mode when the number of electrode fingers in the narrow-pitch electrode finger portion B and the number of electrode fingers in the narrow-pitch electrode finger portion C are different from those of the comparative example. As in the comparative example, in FIG. 6, the solid line represents the result when the number of electrode fingers in each of the narrow-pitch electrode finger portion B and the narrow-pitch electrode finger portion C is 4. In contrast, the dotted line represents the result when the number of electrode fingers in the narrow-pitch electrode finger portion B is 3 and the number of electrode fingers in the narrow-pitch electrode finger portion C is 5. The alternate long and short dash line represents the result when the number of electrode fingers in the narrow-pitch electrode finger portion B is 3 and the number of electrode fingers in the narrow-pitch electrode finger portion C is 7. As the difference between the number of electrode fingers in the narrow-pitch electrode finger portion B and the number of electrode fingers in the narrow-pitch electrode finger portion C is increased, a greater ripple Y appears in the vicinity of the low frequency end of the passband. The ripple Y appears between the resonance point in the 0th-order mode and the resonance point in the second-order mode. Accordingly, by controlling the design parameters and the frequency point of the ripple Y, the ripple Y can be located in the slope portion in the low frequency end of the passband. That is, by using the ripple Y, the steepness of the filter characteristics in the low frequency range of the passband can be increased.

However, at the same time, a ripple Z appears between the resonance point in the 0th-order mode and a resonance point in the inter-IDT electrode mode. The ripple Z is a large spike-shaped ripple appearing in the passband. Accordingly, it is preferable to reduce the ripple Z.

The inventor of the present invention discovered that the ripple Z can be reduced by using the period of electrode fingers in the narrow-pitch electrode finger portion B, which is different from that in the narrow-pitch electrode finger portion C.

Figure 7:
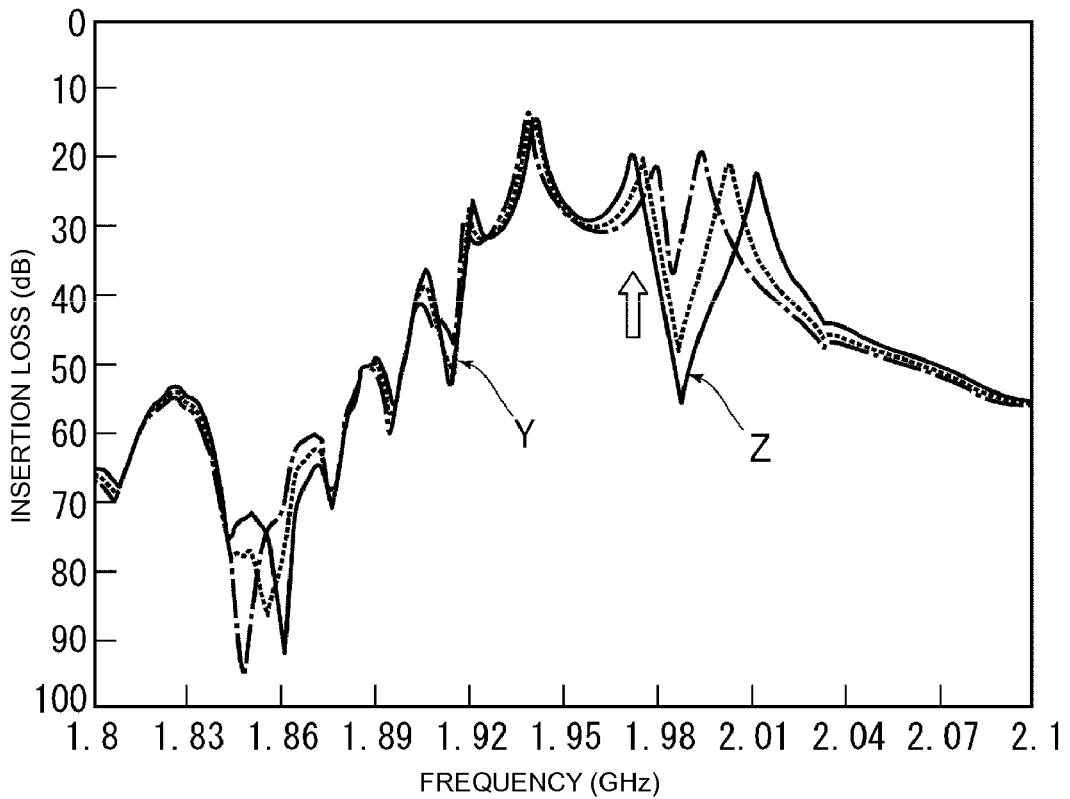
FIG. 7 illustrates a change in the resonant mode when the period of electrode fingers in the narrow-pitch electrode finger portion B and the period of electrode fingers in the narrow-pitch electrode finger portion C are changed, according to the first preferred embodiment of the present invention.

FIG. 7 illustrates a change in the resonant mode when the period of electrode fingers in the narrow-pitch electrode finger portion B is different from that in the narrow-pitch electrode finger portion C.

In FIG. 7, the solid line represents the result when the period in the narrow-pitch electrode finger portion B is the same or substantially the same as that in the narrow-pitch electrode finger portion C. The dotted line represents the result when the period in the narrow-pitch electrode finger portion B is less than that in the narrow-pitch electrode finger portion C by about 0.04 μm. The alternate long and short dash line represents the result when the period in the narrow-pitch electrode finger portion B is less than that in the narrow-pitch electrode finger portion C by about 0.08 μm.

As shown in FIG. 7, by using the period of electrode fingers in the narrow-pitch electrode finger portion B, which is preferably less than the period of electrode fingers in the narrow-pitch electrode finger portion C, the ripple Z is reduced. In particular, by increasing the difference between the periods of the electrode fingers, the ripple Z is further reduced.

In FIG. 7, the period in the narrow-pitch electrode finger portion B is preferably set to be less than that in the narrow-pitch electrode finger portion C. However, if the period of electrode fingers in the narrow-pitch electrode finger portion B is set to be greater than that in the narrow-pitch electrode finger portion C, the ripple Z is increased. That is, by setting the period of electrode fingers in one of the narrow-pitch electrode finger portions B and C including a smaller number of the electrode fingers to be less than the period of electrode fingers in the other narrow-pitch electrode finger portion, the ripple Z is reduced. In addition, the steepness of the filter characteristic is effectively increased by using the ripple Y.

Accordingly, when, unlike the first preferred embodiment, the number of the electrode fingers in the narrow-pitch electrode finger portion B is set to be greater than that in the narrow-pitch electrode finger portion C, an advantage that is substantially the same as the above-described advantage can be obtained by setting the period of electrode fingers in the narrow-pitch electrode finger portion B to be greater than that in the narrow-pitch electrode finger portion C.

In addition, even when the period of electrode fingers in the narrow-pitch electrode finger portion B is the same or substantially the same as that in the narrow-pitch electrode finger portion C, an advantage that is substantially the same as the above-described advantage can be obtained by setting the period of electrode fingers in the narrow-pitch electrode finger portion A to be different from that in the narrow-pitch electrode finger portion D. The reason for that is described with reference to FIG. 8.

Figure 8:
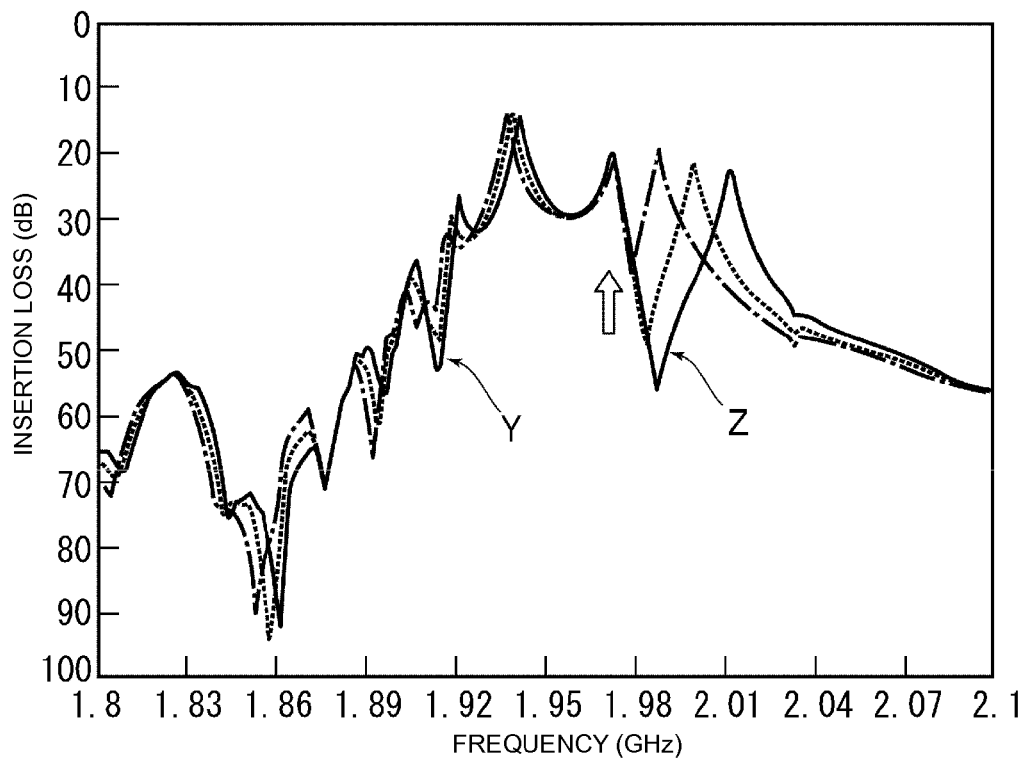
FIG. 8 illustrates a change in the resonant mode and, in particular, a change in the ripple Z when the period of electrode fingers in the narrow-pitch electrode finger portion A and the period of electrode fingers in the narrow-pitch electrode finger portion D are changed, according to the first preferred embodiment of the present invention.

FIG. 8 illustrates a change in the ripple Z when the period of electrode fingers in the narrow-pitch electrode finger portion A is set to be different from that in the narrow-pitch electrode finger portion D. In this example, the period and the pitch of electrode fingers in the narrow-pitch electrode finger portion B are the same or substantially the same as those in the narrow-pitch electrode finger portion C.

In FIG. 8, the solid line represents the result when the periods of the electrode fingers in the narrow-pitch electrode finger portion A and the narrow-pitch electrode finger portion D are the same or substantially the same. The dotted line represents the result when the period of electrode fingers in the narrow-pitch electrode finger portion A is less than that in the narrow-pitch electrode finger portion D by about 0.04 μm. The alternate long and short dash line represents the result when the period of electrode fingers in the narrow-pitch electrode finger portion A is less than that in the narrow-pitch electrode finger portion D by about 0.08 μm. As can be seen from FIG. 8, as the period in the narrow-pitch electrode finger portion A is reduced with respect to the period in the narrow-pitch electrode finger portion D, that is, as the difference between the periods is increased, the ripple Z is reduced.

In FIG. 8, the period in the narrow-pitch electrode finger portion A is preferably set to be less than that in the narrow-pitch electrode finger portion D. However, if the period of electrode fingers in the narrow-pitch electrode finger portion A is set to be greater than that in the narrow-pitch electrode finger portion D, the ripple Z is increased. That is, the period of electrode fingers in one of the narrow-pitch electrode finger portions A and the narrow-pitch electrode finger portion D that faces one of the narrow-pitch electrode finger portion B and the narrow-pitch electrode finger portion C including a smaller number of electrode fingers is preferably reduced.

As can be seen from FIGS. 7 and 8, preferably by using the period of electrode fingers in the narrow-pitch electrode finger portion B, which is less than the period of electrode fingers in the narrow-pitch electrode finger portion C or using the period of electrode fingers in the narrow-pitch electrode finger portion A, which is less than the period of electrode fingers in the narrow-pitch electrode finger portion D, the ripple Z is effectively reduced. However, in such a case, the ripple Y also tends to be reduced. If the ripple Y is reduced, the effect of improving the steepness in the low frequency range of the passband is reduced.

Accordingly, the inventor of the present invention further discovered that, in order to increase the ripple Y, it is effective to control the period of electrode fingers in an electrode finger portion other than the narrow-pitch electrode finger portions of the first, third, and fifth IDT electrodes 11a, 11c, and 11e. That is, it is effective to control the periods of the electrode fingers in main electrode finger portions that determine the frequency of the filter.

Figure 9:
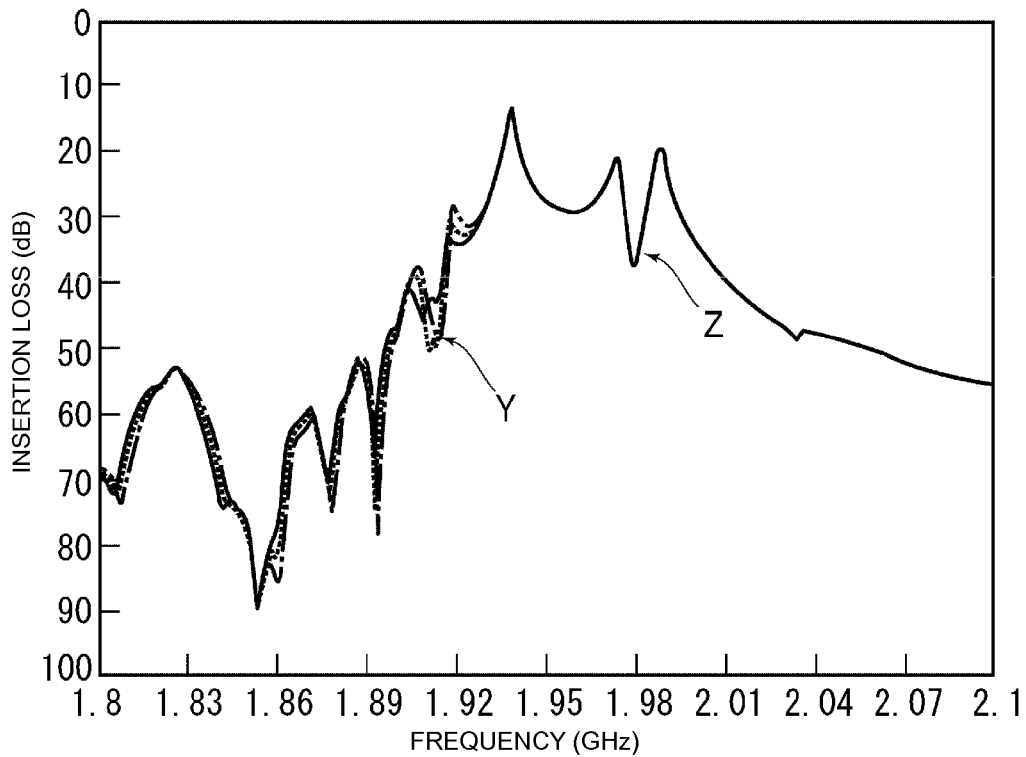
FIG. 9 illustrates a change in the ripple Y and a change in the ripple Z when the period of electrode fingers in a portion other than the narrow-pitch electrode finger portions of the first and fifth IDT electrodes and the period of electrode fingers in a portion other than the narrow-pitch electrode finger portion of the third IDT electrode are changed, according to the first preferred embodiment of the present invention.

FIG. 9 illustrates a change in the ripple Y and a change in the ripple Z when using the period of electrode fingers of the first IDT electrode 11a and the fifth IDT electrode 11e, which is different from the period of electrode fingers of the third IDT electrode 11c. More specifically, in FIG. 9, the solid line represents the result when the period of electrode fingers in a portion (a main electrode finger portion) other than the narrow-pitch electrode finger portions of the third IDT electrode 11c is the same or substantially the same as the period of electrode fingers in portions (main electrode finger portions) other than the narrow-pitch electrode finger portions of the first IDT electrode 11a and the fifth IDT electrode 11e. The dotted line represents the result when the period of electrode fingers of the third IDT electrode 11c is less than that of the first IDT electrode 11a and the fifth IDT electrode 11e by about 0.03 p.m. The alternate long and short dash line represents the result when the period of electrode fingers of the third IDT electrode 11c located in the middle is less than the period of electrode fingers in the main electrode finger portions of the first IDT electrode 11a and the fifth IDT electrode 11e by about 0.06 p.m.

As can be seen from FIG. 9, as the difference between the period of electrode fingers in the first IDT electrode 11a and the fifth IDT electrode 11e and the period of electrode fingers in the third IDT electrode 11c increases, the ripple Y increases. In such a case, the ripple Z is negligibly changed. Accordingly, it is preferable for the period of electrode fingers in a portion other than the narrow-pitch electrode finger portions of the third IDT electrode 11c to be different from the period of electrode fingers in portions other than the narrow-pitch electrode finger portion of the first IDT electrode 11a and the fifth IDT electrode 11e.

In FIG. 9, the period of electrode fingers in a portion other than the narrow-pitch electrode finger portion of the third IDT electrode 11c is preferably set to be less than the period of electrode fingers in portions other than the narrow-pitch electrode finger portion of the first IDT electrode 11a and the fifth IDT electrode 11e. However, if the period of electrode fingers in portions other than the narrow-pitch electrode finger portion of the first IDT electrode 11a and the fifth IDT electrode 11e is set to be greater than the narrow-pitch electrode finger portion of the first IDT electrode 11a and the fifth IDT electrode 11e, then the ripple Y reduces. That is, in order to increase the ripple Y, the period of electrode fingers in the main electrode finger portion other than the narrow-pitch electrode finger portion of an IDT electrode facing one of the narrow-pitch electrode finger portion B and the narrow-pitch electrode finger portion C having a smaller number of electrode fingers must be increased. Accordingly, if the number of electrode fingers in the narrow-pitch electrode finger portion B is greater than that in the narrow-pitch electrode finger portion C, it is preferable for the period of electrode fingers in the main electrode finger portions other than the narrow-pitch electrode finger portions of the first IDT electrode 11a and the fifth IDT electrode 11e to be less than the period of electrode fingers in the main electrode finger portion other than the narrow-pitch electrode finger portion of the third IDT electrode 11c.

Figure 10:
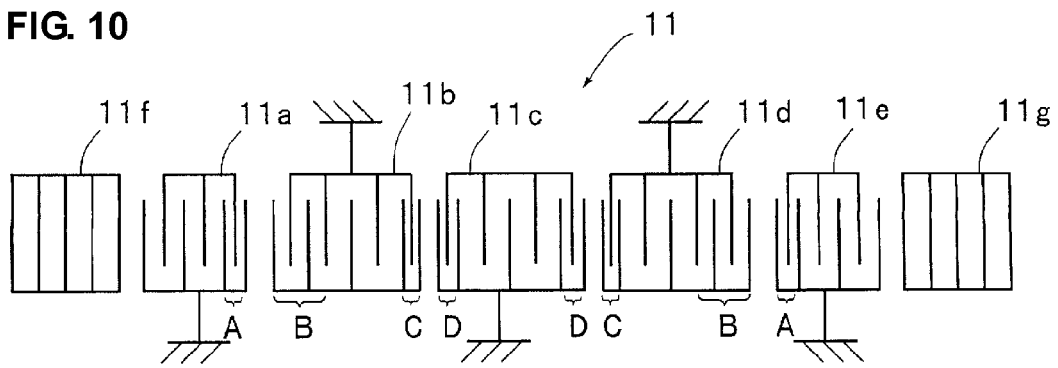
FIG. 10 is a schematic plan view of the structure of a narrow-pitch electrode finger portion of a 5-IDT longitudinally coupled resonator type elastic wave filter portion according to a modification of the first preferred embodiment of the present invention.

A modification of the first preferred embodiment is described with reference to FIGS. 10 to 14. FIG. 10 is a schematic plan view of the structure of a narrow-pitch electrode finger portion of the first longitudinally coupled resonator type elastic wave filter portion 11 of an elastic wave filter device according to a modification of the first preferred embodiment.

In this modification, a relationship between the number of electrode fingers and the period of a narrow-pitch electrode finger portion is preferably opposite to that of the first preferred embodiment. That is, as shown in FIG. 10, the number of the electrode fingers in the narrow-pitch electrode finger portion B is preferably greater than that in the narrow-pitch electrode finger portion C. The period of electrode fingers in the narrow-pitch electrode finger portion B is preferably greater than that in the narrow-pitch electrode finger portion C. In addition, the period of electrode fingers in portions other than the narrow-pitch electrode finger portions of the first IDT electrode 11a and the fifth IDT electrode 11e is preferably less than the period of electrode fingers in a portion other than the narrow-pitch electrode finger portion of the third IDT electrode 11c. With this configuration, as in the first preferred embodiment, the ripple Y is increased and, therefore, the steepness of the filter characteristic in the low frequency range is increased. Furthermore, the ripple Z is reduced. This is described with reference to FIGS. 11 to 14.

Figure 11:
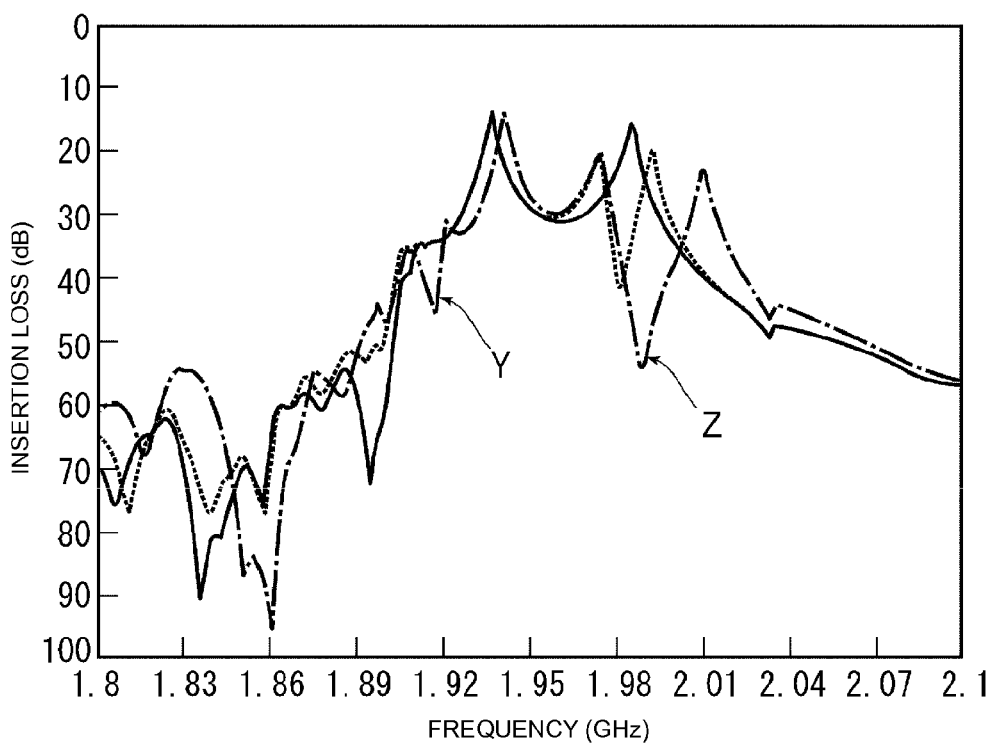
FIG. 11 illustrates a change in the ripple Y and a change in the ripple Z when the number of electrode fingers in the narrow-pitch electrode finger portion B is made different from that in the narrow-pitch electrode finger portion C according to the modification of the first preferred embodiment of the present invention.

FIG. 11 illustrates a change in the ripple Y and a change in the ripple Z when the number of electrode fingers in the narrow-pitch electrode finger portion B is set to be different from that in the narrow-pitch electrode finger portion C. In FIG. 11, the solid line represents the result when the number of electrode fingers in each of the narrow-pitch electrode finger portion B and the narrow-pitch electrode finger portion C is 4. In contrast, the dotted line represents the result when the number of electrode fingers in the narrow-pitch electrode finger portion B is 5 and the number of electrode fingers in the narrow-pitch electrode finger portion C is 3. The alternate long and short dash line represents the result when the number of electrode fingers in the narrow-pitch electrode finger portion B is 7 and the number of electrode fingers in the narrow-pitch electrode finger portion C is 3.

As can be seen from FIG. 11, as the number of electrode fingers in the narrow-pitch electrode finger portion B is increased with respect to that in the narrow-pitch electrode finger portion C, the ripple Y is increased.

However, a ripple Z is increased as the number of electrode fingers in the narrow-pitch electrode finger portion B is increased with respect to that in the narrow-pitch electrode finger portion C.

Figure 12:
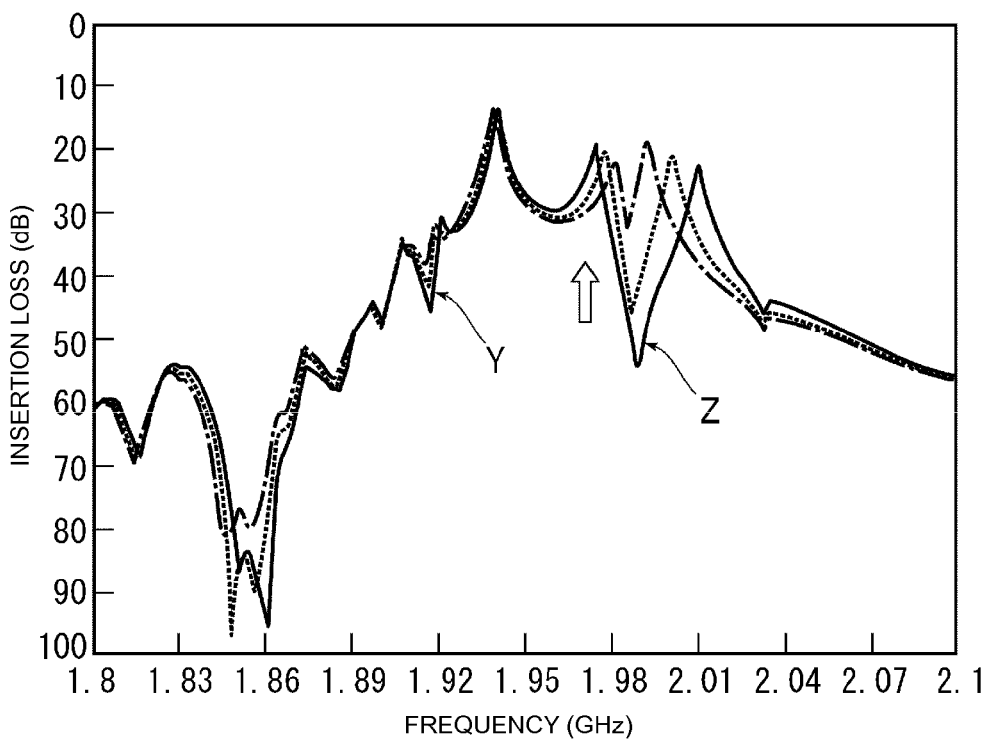
FIG. 12 illustrates changes in the resonant modes when the period of electrode fingers in the narrow-pitch electrode finger portion B and the period of electrode fingers in the narrow-pitch electrode finger portion C are changed, according to the modification of the first preferred embodiment of the present invention.

FIG. 12 illustrates a relationship among the period of electrode fingers in the narrow-pitch electrode finger portion B, the period of electrode fingers in the narrow-pitch electrode finger portion C, the ripple Y, and the ripple Z. In FIG. 12, the solid line represents the result when the periods of the electrode fingers in the narrow-pitch electrode finger portions B and C are the same or substantially the same. The dotted line represents the result when the period in the narrow-pitch electrode finger portion B is greater than that in the narrow-pitch electrode finger portion C by about 0.04 μm. The alternate long and short dash line represents the result when the period in the narrow-pitch electrode finger portion B is greater than that in the narrow-pitch electrode finger portion C by about 0.08 μm.

As can be seen from FIG. 12, by increasing the period of electrode fingers in the narrow-pitch electrode finger portion B with respect to the period in the narrow-pitch electrode finger portion C, an unwanted ripple Z is effectively reduced. In this case, the level of the ripple Y is not significantly changed.

Figure 13:
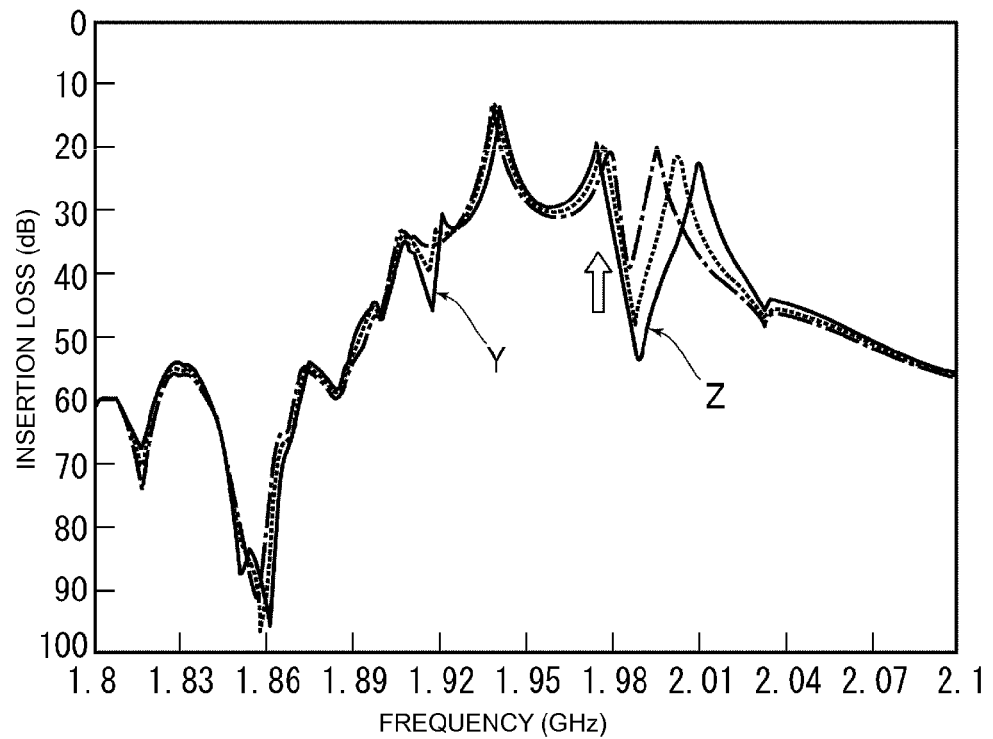
FIG. 13 illustrates changes in the resonant modes and, in particular, a change in the ripple Z when the period of electrode fingers in the narrow-pitch electrode finger portion A and the period of electrode fingers in the narrow-pitch electrode finger portion D are changed, according to the modification of the first preferred embodiment of the present invention.

FIG. 13 illustrates a change in the ripple Z when the pitch of electrode fingers in the narrow-pitch electrode finger portion A and the narrow-pitch electrode finger portion D are changed in the present modification. The solid line represents the result when the periods of electrode fingers in the narrow-pitch electrode finger portions A and D are the same or substantially the same. The dotted line represents the result when the period of electrode fingers in the narrow-pitch electrode finger portion A is greater than that in the narrow-pitch electrode finger portion B by about 0.04 μm. The alternate long and short dash line represents the result when the period of electrode fingers in the narrow-pitch electrode finger portion A is greater than that in the narrow-pitch electrode finger portion B by about 0.08 μm.

As can be seen from FIG. 13, as the period of electrode fingers in the narrow-pitch electrode finger portion A is increased, that is, by increasing the period of electrode fingers in the narrow-pitch electrode finger portion A that faces the narrow-pitch electrode finger portion B, which includes a larger number of electrode fingers in a narrow-pitch electrode finger portion than that in the narrow-pitch electrode finger portion C, so as to be greater than the period of electrode fingers in the narrow-pitch electrode finger portion D, the ripple Z is effectively reduced.

Figure 14:
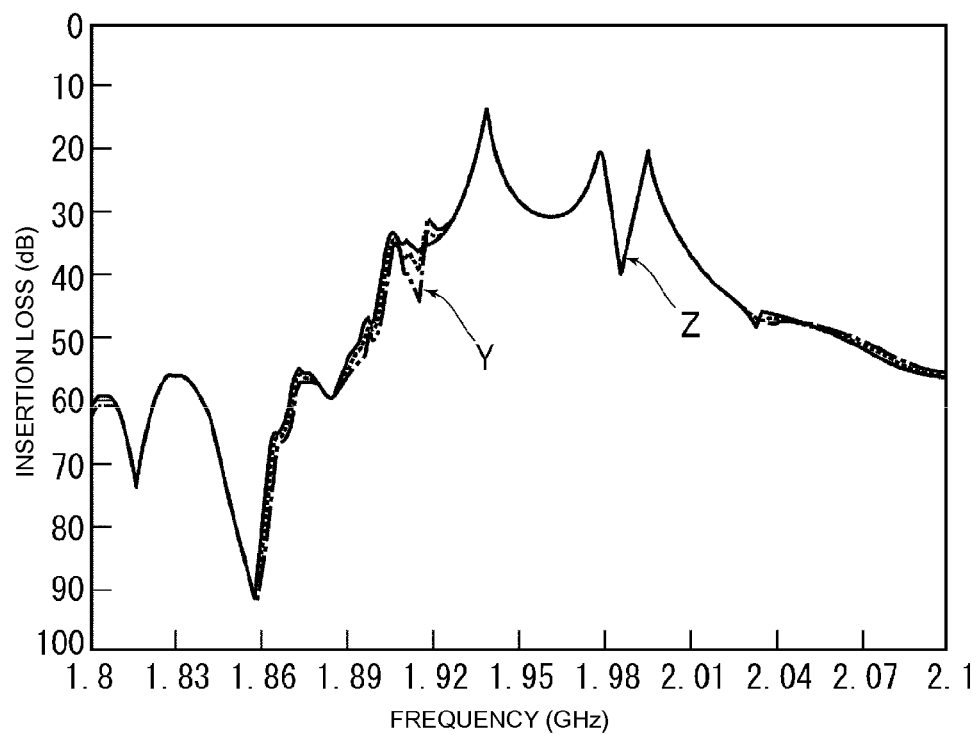
FIG. 14 illustrates a change in the ripple Y and a change in the ripple Z when the period of electrode fingers in a portion other than the narrow-pitch electrode finger portions of the first and fifth IDT electrodes and the period of electrode fingers in portions other than the narrow-pitch electrode finger portions of the third IDT electrode are changed, according to the modification of the first preferred embodiment of the present invention.

FIG. 14 illustrates a relationship among the period of electrode fingers in a portion other than the narrow-pitch electrode finger portion of the third IDT electrode 11c, the period of electrode fingers in portions other than the narrow-pitch electrode finger portions of the first IDT electrode 11a and the fifth IDT electrode 11e, and the ripple Y.

In FIG. 14, the solid line represents the result when the period of electrode fingers in a portion other than the narrow-pitch electrode finger portions of the third IDT electrode 11c and the periods of the electrode fingers in portions other than the narrow-pitch electrode finger portions of the first IDT electrode 11a and the fifth IDT electrode 11e are the same or substantially the same. The dotted line represents the result when the period of electrode fingers of the third IDT electrode 11c is greater than that of the first IDT electrode 11a and the fifth IDT electrode 11e by about 0.03 m. The alternate long and short dash line represents the result when the period of electrode fingers in a portion other than the narrow-pitch electrode finger portion of the third IDT electrode 11c is greater than that of the first IDT electrode 11a and the fifth IDT electrode 11e by about 0.06 p.m.

As can be seen from FIG. 14, as in the example shown in FIG. 9, by using the period of electrode fingers in a portion other than the narrow-pitch electrode finger portion of the first IDT electrode 11a and the fifth IDT electrode 11e, which is different from that of the third IDT electrode 11c, the level of the ripple Y can be effectively controlled. Even in such a case, by setting the period of electrode fingers in portions other than the narrow-pitch electrode finger portions of the first and fifth IDT electrodes facing the narrow-pitch electrode finger portions B including a larger number of electrode fingers to be less than the period of electrode fingers in a portion other than the narrow-pitch electrode finger portion of the third IDT electrode 11c facing the narrow-pitch electrode finger portion C including a smaller number of electrode fingers, the ripple Y can be effectively increased. In this manner, the steepness of the filter characteristic is effectively increased.

In the modification of the first preferred embodiment, the period of electrode fingers in the narrow-pitch electrode finger portion B is preferably set to be greater than the period of electrode fingers in the narrow-pitch electrode finger portion C. However, instead of setting the period of electrode fingers in the narrow-pitch electrode finger portion B to be greater than the period of electrode fingers in the narrow-pitch electrode finger portion C, the period of electrode fingers in the narrow-pitch electrode finger portion A may be set to be greater than the period of electrode fingers in the narrow-pitch electrode finger portion D.

While preferred embodiments of the present invention have been described with reference to the case in which the period of electrode fingers in a narrow-pitch electrode finger portion is constant, the period of electrode fingers in a narrow-pitch electrode finger portion needs not be constant. For example, the period of electrode fingers in a narrow-pitch electrode finger portion may preferably be gradually changed, as described in Japanese Unexamined Patent Application Publication No. 2002-528987. Alternatively, a plurality of sub-portions having different periods may preferably be provided in a narrow-pitch electrode finger portion, as described in Japanese Unexamined Patent Application Publication No. 2003-243965. When, as described above, the period of electrode fingers in a narrow-pitch electrode finger portion is not constant, the advantages of preferred embodiments the present invention can be obtained if the average period of electrode fingers in a narrow-pitch electrode finger portion satisfies the above-described relationship. That is, in preferred embodiments of the present invention, the term "period of electrode fingers in a narrow-pitch electrode finger portion" refers to the average period of electrode fingers in a narrow-pitch electrode finger portion when the period of electrode fingers in a narrow-pitch electrode finger portion is not constant.

In addition, while the first preferred embodiment and the modification thereof have been described with reference to a surface acoustic wave filter device using surface acoustic waves, preferred embodiments of the present invention are similarly applicable to a boundary elastic wave filter device using boundary elastic waves, in addition to a surface acoustic wave filter device, since preferred embodiments of the present invention are characterized by the electrode structure. Thus, the steepness of the filter characteristic can be similarly increased in a boundary elastic wave filter device.

Second Preferred Embodiment

A second preferred embodiment of the present invention will be described below. Similar to the first preferred embodiment, the second preferred embodiment has the structure as shown in FIG. 1. Accordingly, the same reference numbers will be used to describe similar components in the second preferred embodiment, and the descriptions thereof are not repeated.

Figure 15:
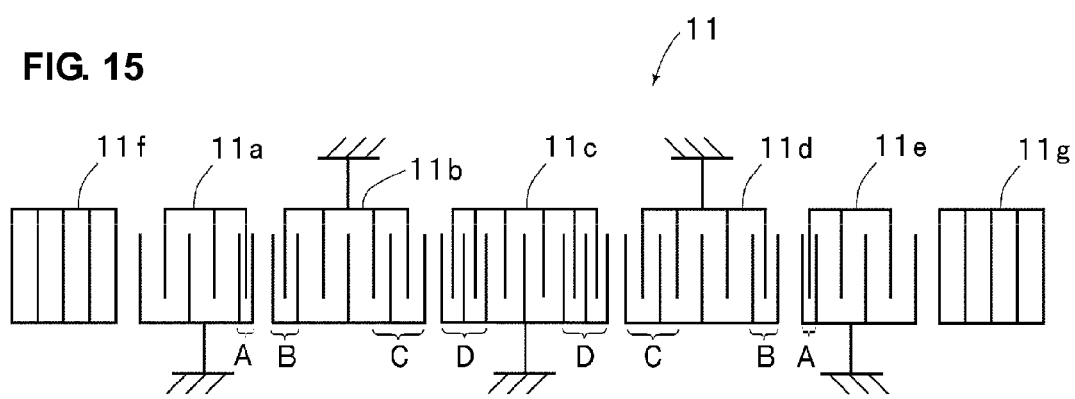
FIG. 15 is a schematic plan view of the structure of a narrow-pitch electrode finger portion of a first longitudinally coupled resonator type elastic wave filter portion according to a second preferred embodiment of the present invention.

As shown in FIG. 15, according to the second preferred embodiment, in a first longitudinally coupled resonator type elastic wave filter portion 11, the number of electrode fingers in narrow-pitch electrode finger portions disposed at the ends of a first IDT electrode 11a and a fifth IDT electrode 11e, that is, the number of electrode fingers in a narrow-pitch electrode finger portion A is preferably less than the number of electrode fingers in each of narrow-pitch electrode finger portions provided on either end of the third IDT electrode 11c, that is, a narrow-pitch electrode finger portion D. The period of electrode fingers in each of narrow-pitch electrode finger portions provided in the ends of second IDT electrode 11b and the fourth IDT electrode 11d adjacent to the first IDT electrode 11a and the fifth IDT electrode 11e, respectively, that is, the period of electrode fingers in the narrow-pitch electrode finger portion B is preferably less than the period of electrode fingers in a narrow-pitch electrode finger portions provided in the end portions of the second IDT electrode 11b and the fourth IDT electrode 11d adjacent to the third IDT electrode 11c, that is, the period of electrode fingers in the narrow-pitch electrode finger portion C. The period of electrode fingers in a portion other than the narrow-pitch electrode finger portions D of the third IDT electrode 11c is preferably less than the period of electrode fingers in each of the portions other than the narrow-pitch electrode finger portions A of the first IDT electrode 11a and the fifth IDT electrode 11e. A second longitudinally coupled resonator type elastic wave filter portion 12 has a structure similar to that of the first longitudinally coupled resonator type elastic wave filter portion 11. Thus, in the elastic wave filter device 1, the steepness of the filter characteristic in the low frequency range of the passband can be effectively increased. This is described with reference to FIGS. 16 to 19.

Figure 16:
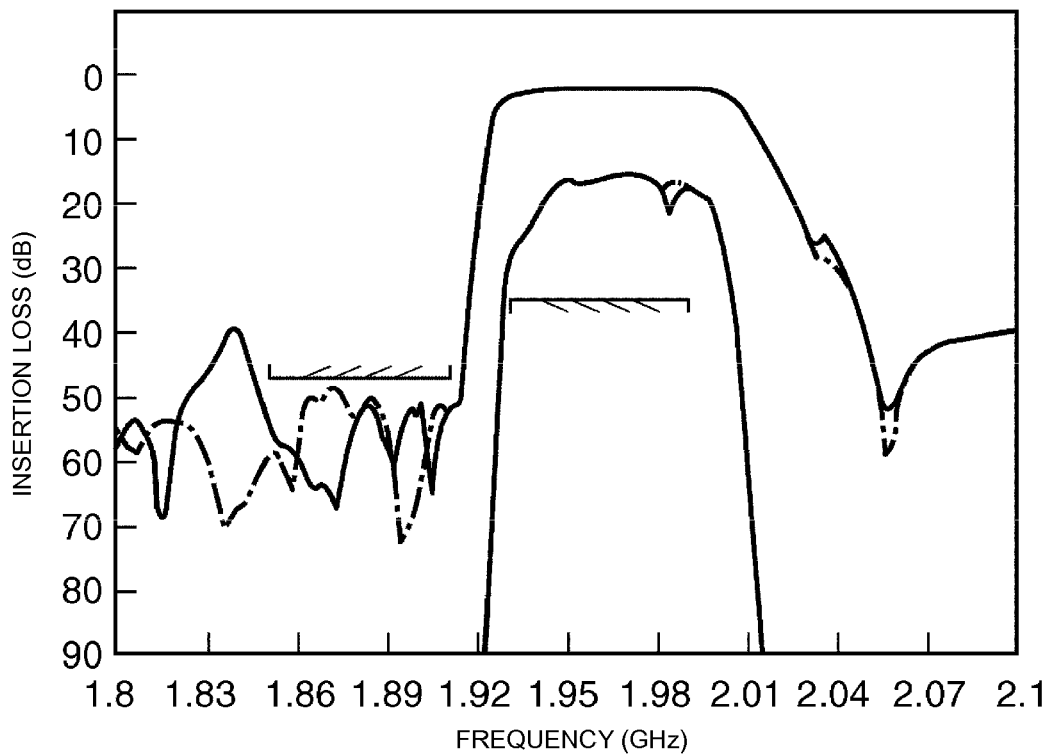
FIG. 16 illustrates the filter characteristics of an elastic wave filter device according to the second preferred embodiment of the present invention and an elastic wave filter device serving as a comparative example.

FIG. 16 illustrates the filter characteristics of an elastic wave filter device according to the second preferred embodiment. The solid line represents the result of the second preferred embodiment. The alternate long and short dash line represents the filter characteristic of an elastic wave filter device prepared as a comparative example. The detailed electrode structures of the second preferred embodiment and the comparative example are as follows. Note that, in the following description, the wavelength determined by the period of electrode fingers of an IDT electrode is denoted as "λI".

Specification of First Longitudinally Coupled Resonator Type Elastic Wave Filter Portion 11

Finger cross width of electrode fingers=about 14.9λI

The first IDT electrode 11a and fifth IDT electrode 11e: The number of electrode fingers of each of the IDT electrodes is 37 (note that the number of electrode fingers in the portion A is 3 out of 37).

The third IDT electrode 11c: The number of electrode fingers is 85 (note that the portions D each including 7 electrode fingers are provided at either side thereof).

The second IDT electrode 11b and fourth IDT electrode 11d: The number of electrode fingers of each of the electrodes is 41 (note that the number of electrode fingers in the narrow-pitch electrode finger portion B is 4, the number of electrode fingers in the narrow-pitch electrode finger portion C is 4, and the number of electrode fingers in the other portion is 33).

The number of electrode fingers of each of the first reflector 11f and the second reflector 11g: 65

The metallization ratio: about 0.68

The thickness of an electrode film: about 0.091λI

The period of electrode fingers in the narrow-pitch electrode finger portion B of each of the second IDT electrode 11b and the fourth IDT electrode 11d is less than that in the narrow-pitch electrode finger portion C by about 0.14 μm.

The period of electrode fingers in a portion other than the narrow-pitch electrode finger portions D of the third IDT electrode 11c is less than that in portions other than the narrow-pitch electrode finger portions A of the first IDT electrode 11a and the fifth IDT electrode 11e by about 0.01 μm.

As described above, the structure of the second longitudinally coupled resonator type elastic wave filter portion 12 is similar to that of the first longitudinally coupled resonator type elastic wave filter portion 11, except that the phase of some IDT electrodes is preferably the inverse of the phase of the corresponding IDT electrodes.

Note that, as a comparative example, an elastic wave filter device having a structure similar to that of the second preferred embodiment except for the following structure is prepared:

the number of electrode fingers in each of the narrow-pitch electrode finger portion D and the narrow-pitch electrode finger portion A is 4, and the period of electrode fingers in the narrow-pitch electrode finger portion B is the same or substantially the same as the period of electrode fingers in the narrow-pitch electrode finger portion C.

As can be seen from FIG. 16, according to the second preferred embodiment, the steepness in the vicinity of the low frequency end ranging from about 1.930 GHz to about 1.990 GHz is increased, as compared to that of the comparative example. That is, in the stopband around 1.930 GHz and, more specifically, in the frequency range from about 1.900 GHz to about 1.930 GHz, the steepness is increased. Thus, for the through level of the filter characteristic, the frequency period for which the loss is about 3.5 dB to about 47.0 dB is decreased to a greater extent than that of the comparative example by about 2.1 MHz. If the frequency period is decreased, the tolerance for a variation in frequency caused by an assembly-to-assembly variation can be increased. Furthermore, the elastic wave filter device 1 having small degradation of the insertion loss and the attenuation even when the ambient temperature varies is provided.

Figure 17:
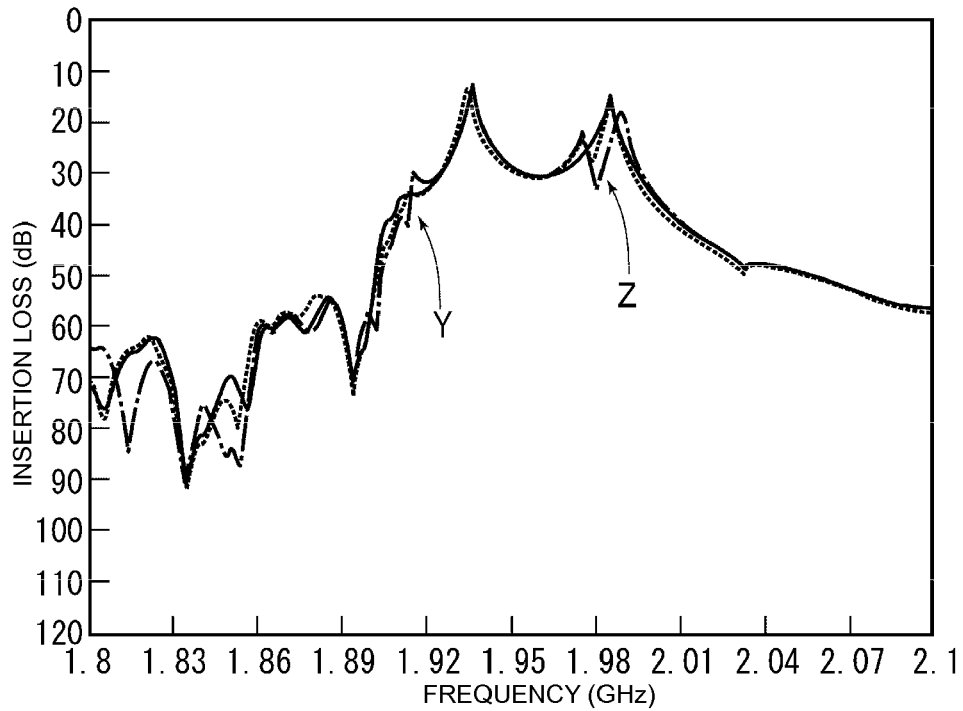
FIG. 17 illustrates a change in the ripple Y and a change in the ripple Z when the number of electrode fingers in the narrow-pitch electrode finger portion A is made different from the number of electrode fingers in the narrow-pitch electrode finger portion D according to the second preferred embodiment of the present invention.

Unlike the comparative example, FIG. 17 illustrates a change in the resonant mode when the number of electrode fingers in the narrow-pitch electrode finger portion A is set to be different from the number of electrode fingers in the narrow-pitch electrode finger portion D. As in the comparative example, in FIG. 17, the solid line represents the result when the number of electrode fingers in each of the narrow-pitch electrode finger portion B and the narrow-pitch electrode finger portion C is 4. The dotted line represents the result when the number of electrode fingers in the narrow-pitch electrode finger portion A is 3 and the number of electrode fingers in the narrow-pitch electrode finger portion D is 5. The alternate long and short dash line represents the result when the number of electrode fingers in the narrow-pitch electrode finger portion A is 3 and the number of electrode fingers in the narrow-pitch electrode finger portion D is 7.

As can be seen from the result shown in FIG. 17, as the difference between the number of electrode fingers in the narrow-pitch electrode finger portion A and the number of electrode fingers in the narrow-pitch electrode finger portion D increases, a larger ripple Y appears in the vicinity of the low frequency end of the passband. The ripple Y appears between the resonance point in the 0th-order mode and the resonance point in the second-order mode. Accordingly, by controlling the design parameters and the frequency point of the ripple Y, the ripple Y can be located in the slope portion in the low frequency end of the passband. That is, by using the ripple Y, the steepness of the filter characteristic in the low frequency range of the passband is increased.

However, at the same time, a ripple Z appears between the resonance point in the 0th-order mode and a resonance point in the inter-IDT electrode mode. The ripple Z is a large spike-shaped ripple appearing in the passband. Accordingly, it is preferable that the ripple Z be reduced.

The inventor of the present invention discovered that the ripple Z can be reduced by using the period of electrode fingers in the narrow-pitch electrode finger portion B, which is different from that in the narrow-pitch electrode finger portion C.

Figure 18:
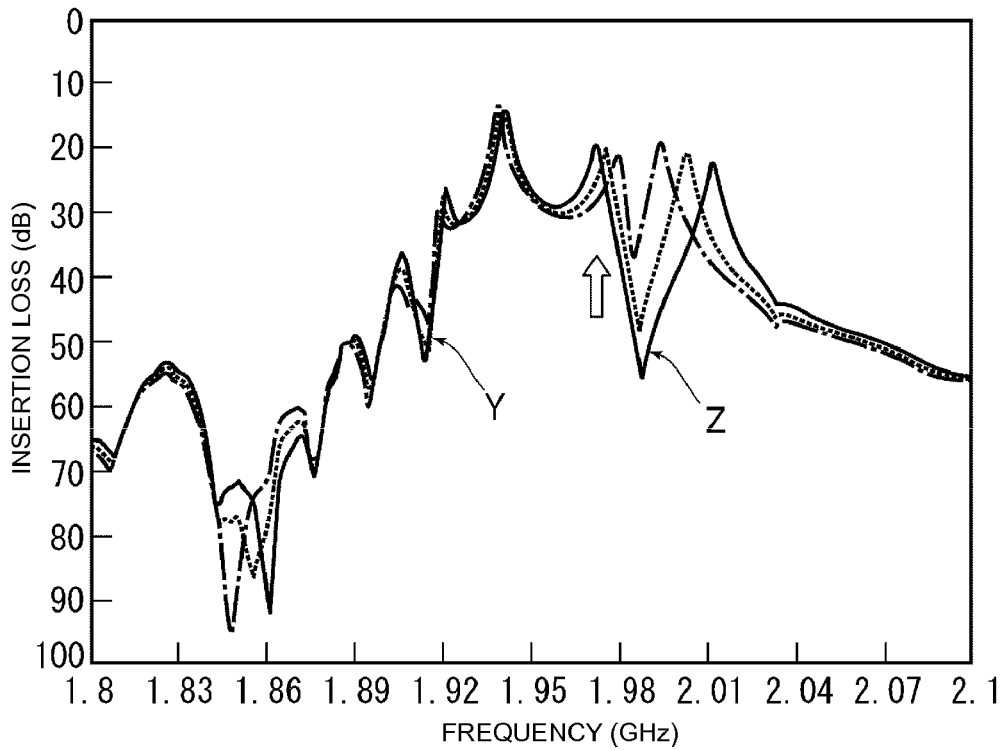
FIG. 18 illustrates a change in the resonant mode when the period of electrode fingers in the narrow-pitch electrode finger portion B and the period of electrode fingers in the narrow-pitch electrode finger portion C are changed, according to the second preferred embodiment of the present invention.

FIG. 18 illustrates a change in the resonant mode when the period of electrode fingers in the narrow-pitch electrode finger portion B is set to be different from that in the narrow-pitch electrode finger portion C.

In FIG. 18, the solid line represents the result when the period in the narrow-pitch electrode finger portion B is the same or substantially the same as that in the narrow-pitch electrode finger portion C. The dotted line represents the result when the period in the narrow-pitch electrode finger portion B is less than that in the narrow-pitch electrode finger portion C by about 0.04 μm. The alternate long and short dash line represents the result when the period in the narrow-pitch electrode finger portion B is less than that in the narrow-pitch electrode finger portion C by about 0.08 μm.

As can be seen from FIG. 18, by using the period of electrode fingers in the narrow-pitch electrode finger portion B, which is less than the period of electrode fingers in the narrow-pitch electrode finger portion C, the ripple Z can be effectively reduced. In particular, by increasing the difference between the periods of the electrode fingers, the ripple Z can be further reduced.

In FIG. 18, the period of electrode fingers in the narrow-pitch electrode finger portion B is preferably set to be less than that in the narrow-pitch electrode finger portion C. However, if the period of electrode fingers in the narrow-pitch electrode finger portion B is increased with respect to that in the narrow-pitch electrode finger portion C, the ripple Z is increased. That is, by setting the period of electrode fingers in one of the narrow-pitch electrode finger portions B and C that faces one of the narrow-pitch electrode finger portions A and D including a smaller number of electrode fingers to be less than the period of electrode fingers in the other of the narrow-pitch electrode finger portions B and C, the ripple Z is reduced. In addition, the steepness of the filter characteristic is effectively increased by utilizing the ripple Y.

Accordingly, when, unlike the second preferred embodiment, the number of the electrode fingers in the narrow-pitch electrode finger portion A is greater than that in the narrow-pitch electrode finger portion D, the period of electrode fingers in the narrow-pitch electrode finger portion B is preferably set to be greater than the period of electrode fingers in the narrow-pitch electrode finger portion C. Even in such a case, similar to the second preferred embodiment, the ripple Z is reduced. In addition, the steepness of the filter characteristic is effectively increased by utilizing the ripple Y.

In addition, even when the period of electrode fingers in the narrow-pitch electrode finger portion B is the same or substantially the same as that in the narrow-pitch electrode finger portion C, the ripple Z can be reduced in a similar manner preferably by using the period of electrode fingers in the narrow-pitch electrode finger portion A, which is different from the period of electrode fingers in the narrow-pitch electrode finger portion D. This is described with reference to FIG. 19.

Figure 19:
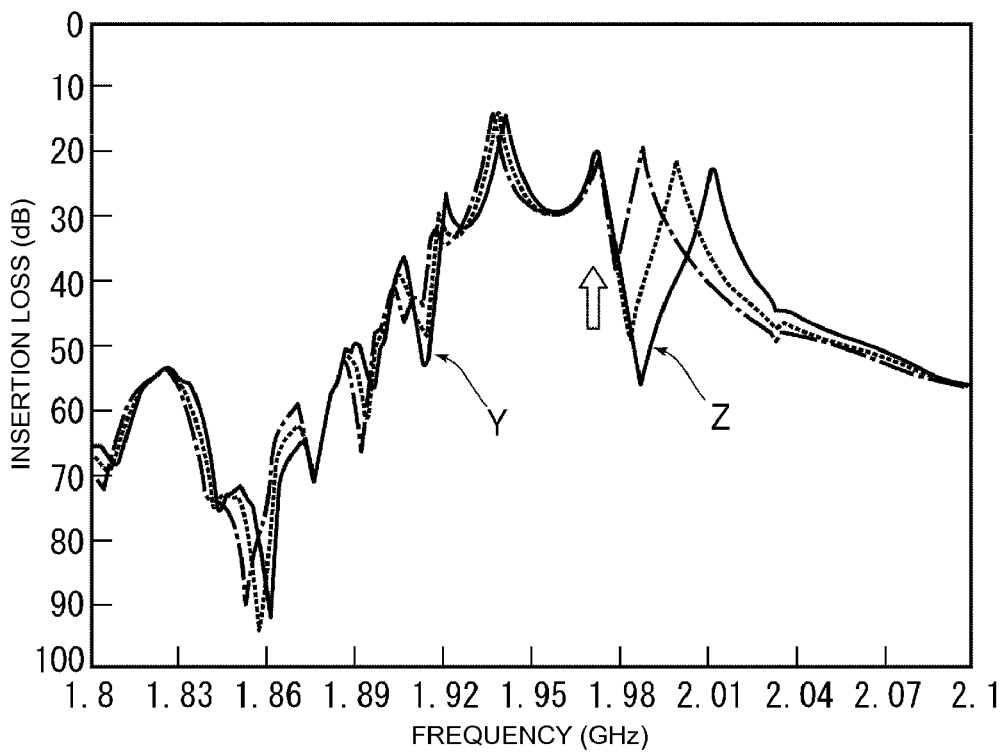
FIG. 19 illustrates a change in the resonant mode and, in particular, a change in the ripple Z when the period of electrode fingers in the narrow-pitch electrode finger portion A and the period of electrode fingers in the narrow-pitch electrode finger portion D are changed, according to the second preferred embodiment of the present invention.

FIG. 19 illustrates a change in the ripple Y when the period of electrode fingers in the narrow-pitch electrode finger portion A is set to be different from that in the narrow-pitch electrode finger portion D. In this example, the period and the pitch of electrode fingers in the narrow-pitch electrode finger portion B are the same or substantially the same as those in the narrow-pitch electrode finger portion C.

In FIG. 19, the solid line represents the result when the periods of the electrode fingers in the narrow-pitch electrode finger portion A and the narrow-pitch electrode finger portion D are the same or substantially the same. The dotted line represents the result when the period of electrode fingers in the narrow-pitch electrode finger portion A is less than that in the narrow-pitch electrode finger portion D by about 0.04 μm. The alternate long and short dash line represents the result when the period of electrode fingers in the narrow-pitch electrode finger portion A is less than that in the narrow-pitch electrode finger portion D by about 0.08 μm.

As can be seen from FIG. 19, as the period of electrode fingers in the narrow-pitch electrode finger portion A is reduced with respect to the period of electrode fingers in the narrow-pitch electrode finger portion D, that is, as the difference between the periods is increased, the ripple Z is reduced.

In FIG. 19, the period of electrode fingers in the narrow-pitch electrode finger portion A is preferably less than that in the narrow-pitch electrode finger portion D. However, if the period of electrode fingers in the narrow-pitch electrode finger portion A is set to be greater than that in the narrow-pitch electrode finger portion D, the ripple Z is increased. That is, the period of electrode fingers in one of the narrow-pitch electrode finger portions A and the narrow-pitch electrode finger portion D including a smaller number of electrode fingers must be reduced.

As can be seen from FIGS. 18 and 19, by using the period of electrode fingers in the narrow-pitch electrode finger portion B, which is preferably less than the period of electrode fingers in the narrow-pitch electrode finger portion C or by using the period of electrode fingers in the narrow-pitch electrode finger portion A, which is preferably less than the period of electrode fingers in the narrow-pitch electrode finger portion D, the ripple Z is reduced. However, in such a case, the ripple Y also tends to be reduced. If the ripple Y is reduced, the effect of improving the steepness in the low frequency range of the passband is reduced.

Accordingly, the inventor of the present invention further discovered that, in order to increase the ripple Y without reducing the ripple Z, it is effective to control the periods of the electrode fingers in electrode finger portions other than the narrow-pitch electrode finger portions of the first, third, and fifth IDT electrodes 11a, 11c, and 11e, that is, the electrode fingers in main electrode finger portions that determine the frequency of the filter.

Figure 20:
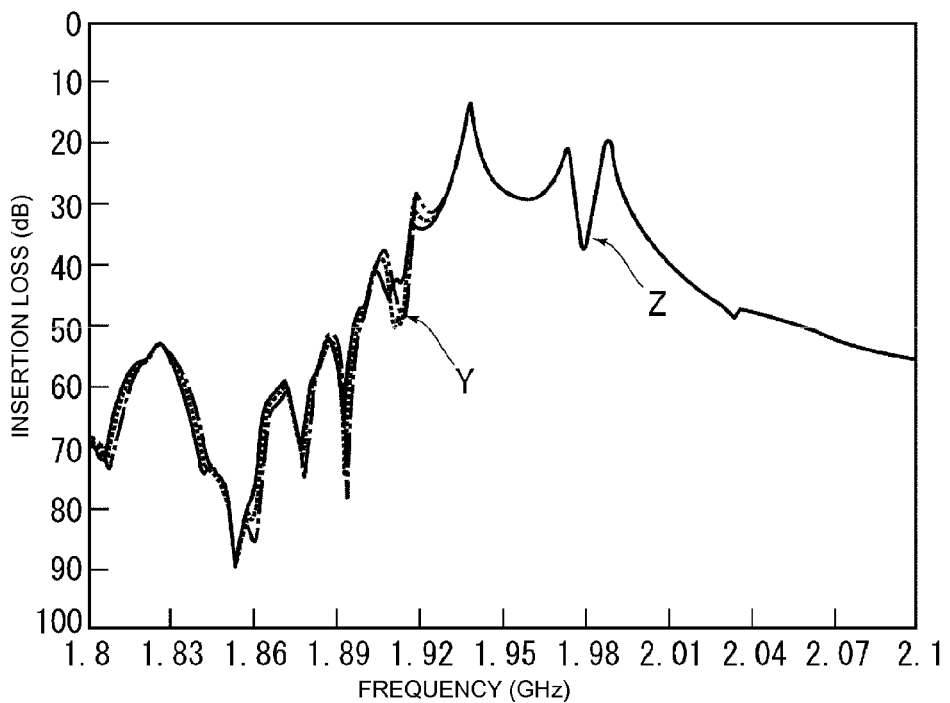
FIG. 20 illustrates a change in the ripple Y and a change in the ripple Z when the period of electrode fingers in a portion other than the narrow-pitch electrode finger portions of the first IDT electrode and the fifth IDT electrode and the period of electrode fingers in a portion other than the narrow-pitch electrode finger portions of the third IDT electrode are changed, according to the second preferred embodiment of the present invention.

FIG. 20 illustrates a change in the ripple Y and a change in the ripple Z when the periods of the electrode fingers in the main electrode finger portions of the first IDT electrode 11a and the fifth IDT electrode 11e, which are different from the period of electrode fingers in the main electrode portion of the third IDT electrode 11c, are changed. More specifically, in FIG. 20, the solid line represents the result when the period of electrode fingers in a portion (a main electrode finger portion) other than the narrow-pitch electrode finger portions of the third IDT electrode 11c is the same or substantially the same as the period of electrode fingers in a portion (a main electrode finger portion) other than the narrow-pitch electrode finger portion of each of the first IDT electrode 11a and the fifth IDT electrode 11e. The dotted line represents the result when the period of electrode fingers of the third IDT electrode 11c located in the middle is less than that of the first IDT electrode 11a and the fifth IDT electrode 11e by about 0.03 μm. The alternate long and short dash line represents the result when the period of electrode fingers of the third IDT electrode 11c located in the middle is less than the period of electrode fingers in the main electrode finger portions of the first IDT electrode 11a and the fifth IDT electrode 11e by about 0.06 μm.

As can be seen from FIG. 20, as the difference between the period of electrode fingers in the first IDT electrode 11a and the fifth IDT electrode 11e and the period of electrode fingers in the third IDT electrode 11c increases, the ripple Y increases. In such a case, the ripple Z is not significantly changed. Accordingly, it is preferable that the period of electrode fingers in a portion other than the narrow-pitch electrode finger portions of the third IDT electrode 11c be different from the period of electrode fingers in portions other than the narrow-pitch electrode finger portions of the first IDT electrode 11a and the fifth IDT electrode 11e.

In FIG. 20, the period of electrode fingers in a portion other than the narrow-pitch electrode finger portion of the third IDT electrode 11c is preferably less than each of the periods of electrode fingers in portions other than the narrow-pitch electrode finger portions of the first IDT electrode 11a and the fifth IDT electrode 11e. However, if the period of electrode fingers in a portion other than the narrow-pitch electrode finger portions of the first IDT electrode 11a and the fifth IDT electrode 11e is increased, the ripple Y decreases. That is, in order to increase the ripple Y, the period of electrode fingers in the main electrode finger portion other than the narrow-pitch electrode finger portion of one of the first IDT electrodes 11a and the third IDT 11c including a smaller number of electrode fingers in the narrow-pitch electrode finger portion thereof must be decreased. Accordingly, if the number of electrode fingers in the narrow-pitch electrode finger portion A is greater than that in the narrow-pitch electrode finger portion D, it is preferable that the period of electrode fingers in a portion other than the narrow-pitch electrode finger portion of the first IDT electrode 11a and the fifth IDT electrode 11e be less than the period of electrode fingers in the main electrode finger portion other than the narrow-pitch electrode finger portion of the third IDT electrode 11c.

Figure 21:
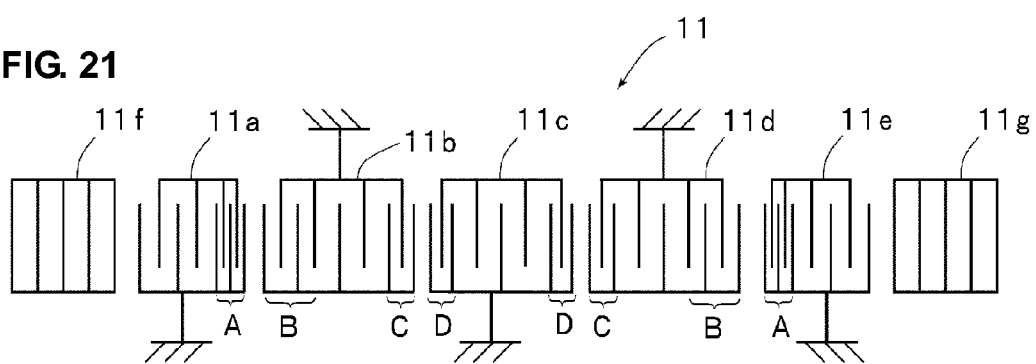
FIG. 21 is a schematic plan view of the structure of a narrow-pitch electrode finger portion of a 5-IDT longitudinally coupled resonator type elastic wave filter portion of an elastic wave filter device according to a modification of the second preferred embodiment of the present invention.

A modification of the second preferred embodiment is described below with reference to FIGS. 21 to 25. FIG. 21 is a schematic plan view of the structure of a narrow-pitch electrode finger portion of the first longitudinally coupled resonator type elastic wave filter portion 11 of an elastic wave filter device according to a modification of the second preferred embodiment.

In this modification, a relationship between the number of electrode fingers and the period of a narrow-pitch electrode finger portion is opposite to that of the second preferred embodiment. That is, as shown in FIG. 21, the number of the electrode fingers in the narrow-pitch electrode finger portion A is preferably greater than that in the narrow-pitch electrode finger portion D. The period of electrode fingers in the narrow-pitch electrode finger portion B is preferably greater than that in the narrow-pitch electrode finger portion C. In addition, the period of electrode fingers in a portion other than the narrow-pitch electrode finger portions D of the third IDT electrode 11c is preferably greater than the period of electrode fingers in a portion other than the narrow-pitch electrode finger portion A of each of the first IDT electrode 11a and the fifth IDT electrode 11e. With this configuration, similar to the second preferred embodiment, the ripple Y can be increased and, therefore, the steepness of the filter characteristic in the low frequency range can be increased. Furthermore, the ripple Z can be reduced. The reason for this is described with reference to FIGS. 22 to 25.

Figure 22:
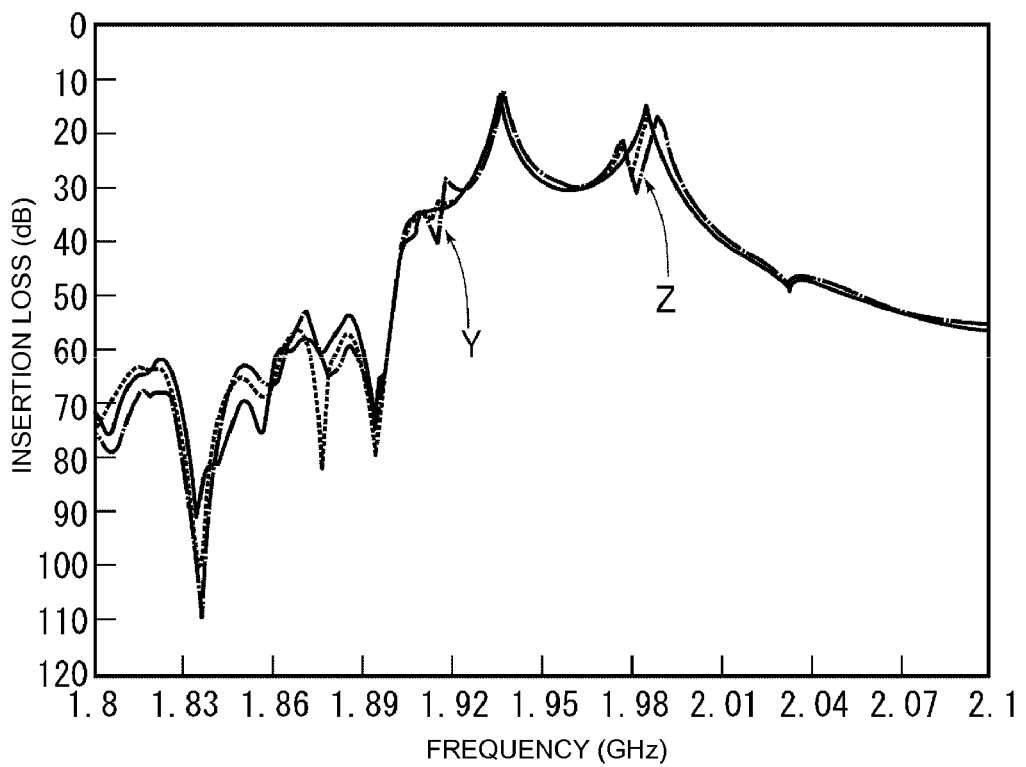
FIG. 22 illustrates a change in the ripple Y and a change in the ripple Z when the number of electrode fingers in the narrow-pitch electrode finger portion A is made different from that in the narrow-pitch electrode finger portion D according to the modification of the second preferred embodiment of the present invention.

FIG. 22 illustrates a change in the ripple Y and a change in the ripple Z when the number of electrode fingers in the narrow-pitch electrode finger portion A is different from that in the narrow-pitch electrode finger portion D. In FIG. 22, the solid line represents the result when the number of electrode fingers in each of the narrow-pitch electrode finger portion A and the narrow-pitch electrode finger portion D is 4. In contrast, the dotted line represents the result when the number of electrode fingers in the narrow-pitch electrode finger portion A is 7 and the number of electrode fingers in the narrow-pitch electrode finger portion D is 3. The alternate long and short dash line represents the result when the number of electrode fingers in the narrow-pitch electrode finger portion A is 9 and the number of electrode fingers in the narrow-pitch electrode finger portion D is 3.

As can be seen from FIG. 22, as the number of electrode fingers in the narrow-pitch electrode finger portion A is increased with respect to that in the narrow-pitch electrode finger portion D, the ripple Y is increased.

However, a ripple Z is also increased as the number of electrode fingers in the narrow-pitch electrode finger portion A is increased with respect to that in the narrow-pitch electrode finger portion D.

Figure 23:
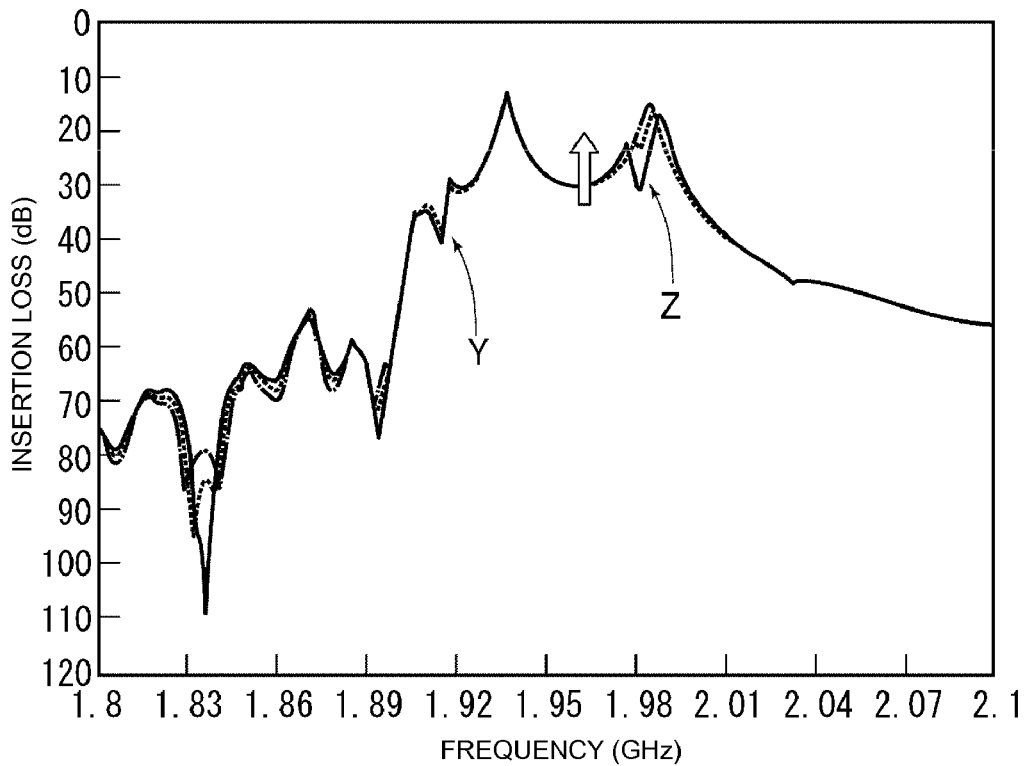
FIG. 23 illustrates a change in the resonant mode when the period of electrode fingers in the narrow-pitch electrode finger portion B and the period of electrode fingers in the narrow-pitch electrode finger portion C are changed, according to the modification of the second preferred embodiment of the present invention.

FIG. 23 illustrates a relationship among the period of electrode fingers in the narrow-pitch electrode finger portion B, the period of electrode fingers in the narrow-pitch electrode finger portion C, the ripple Y, and the ripple Z. In FIG. 23, the solid line represents the result when the periods of the electrode fingers in the narrow-pitch electrode finger portions B and C are the same or substantially the same. The dotted line represents the result when the period in the narrow-pitch electrode finger portion B is greater than that in the narrow-pitch electrode finger portion C by about 0.02 µm. The alternate long and short dash line represents the result when the period in the narrow-pitch electrode finger portion B is greater than that in the narrow-pitch electrode finger portion C by about 0.04 µm.

As can be seen from FIG. 23, by increasing the period of electrode fingers in the narrow-pitch electrode finger portion B with respect to the period in the narrow-pitch electrode finger portion C, an unwanted ripple Z is reduced. In this case, the level of the ripple Y is not substantially changed.

Figure 24:
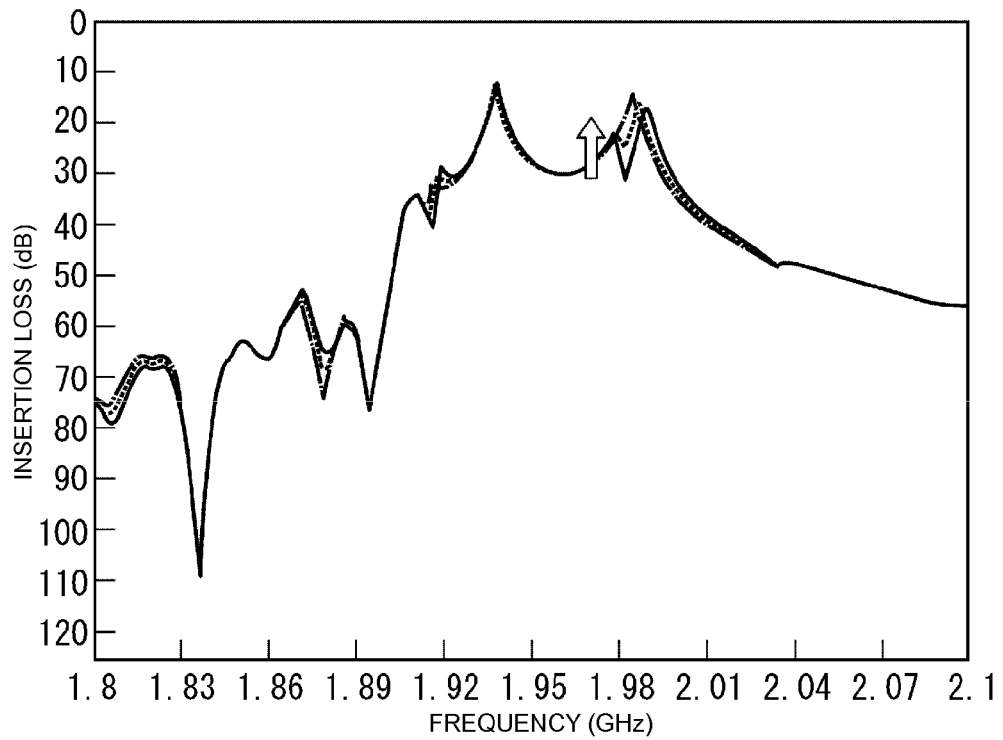
FIG. 24 illustrates a change in the resonant mode and, in particular, a change in the ripple Z when the periods of electrode fingers in the narrow-pitch electrode finger portion A and the narrow-pitch electrode finger portion D are changed, according to the modification of the second preferred embodiment of the present invention.

FIG. 24 illustrates a change in the ripple Z when the periods of electrode fingers in the narrow-pitch electrode finger portion A and the narrow-pitch electrode finger portion D are changed in the present modification. The solid line represents the result when the periods of electrode fingers in the narrow-pitch electrode finger portions A and D are the same or substantially the same. The dotted line represents the result when the period of electrode fingers in the narrow-pitch electrode finger portion A is greater than that in the narrow-pitch electrode finger portion B by about 0.02 µm. The alternate long and short dash line represents the result when the period of electrode fingers in the narrow-pitch electrode finger portion A is greater than that in the narrow-pitch electrode finger portion B by about 0.04 µm.

As can be seen from FIG. 24, as the period of electrode fingers in the narrow-pitch electrode finger portion A is increased, the ripple Z is reduced. That is, by increasing the period of electrode fingers in one of the narrow-pitch electrode finger portion A and the narrow-pitch electrode finger portion D including a larger number of electrode fingers, the ripple Z is reduced.

Figure 25:
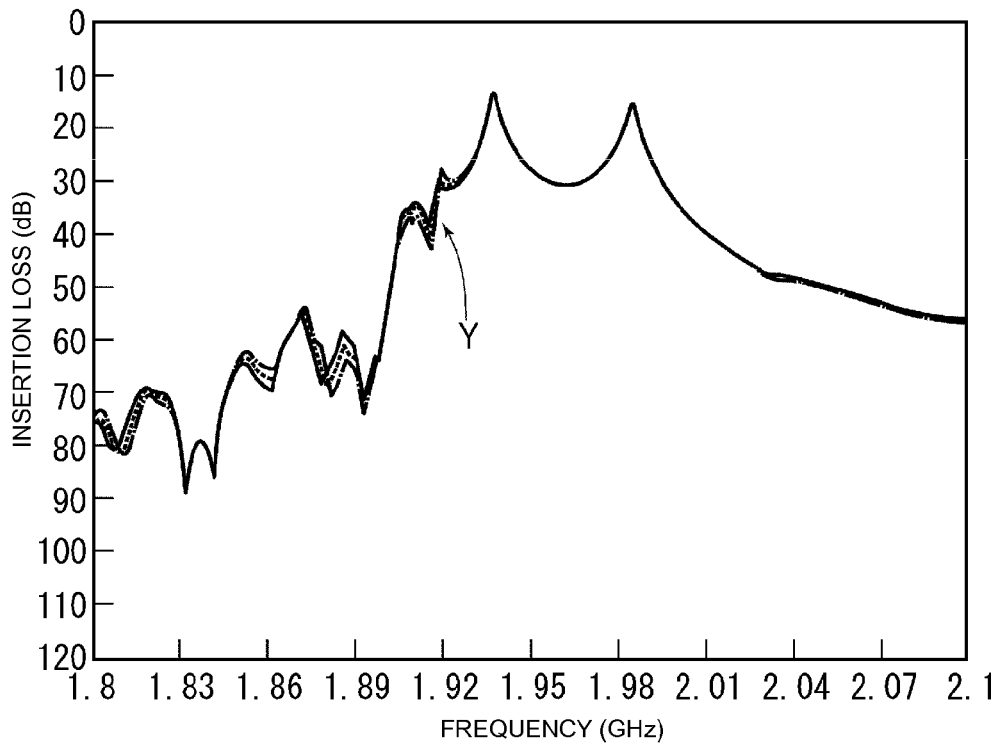
FIG. 25 illustrates a change in the ripple Y and a change in the ripple Z when the period of electrode fingers in a portion other than the narrow-pitch electrode finger portion of the first IDT electrode and the fifth IDT electrode and the period of electrode fingers in portions other than the narrow-pitch electrode finger portions of the third IDT electrode are changed, according to the modification of the second preferred embodiment of the present invention.
Figure 26:
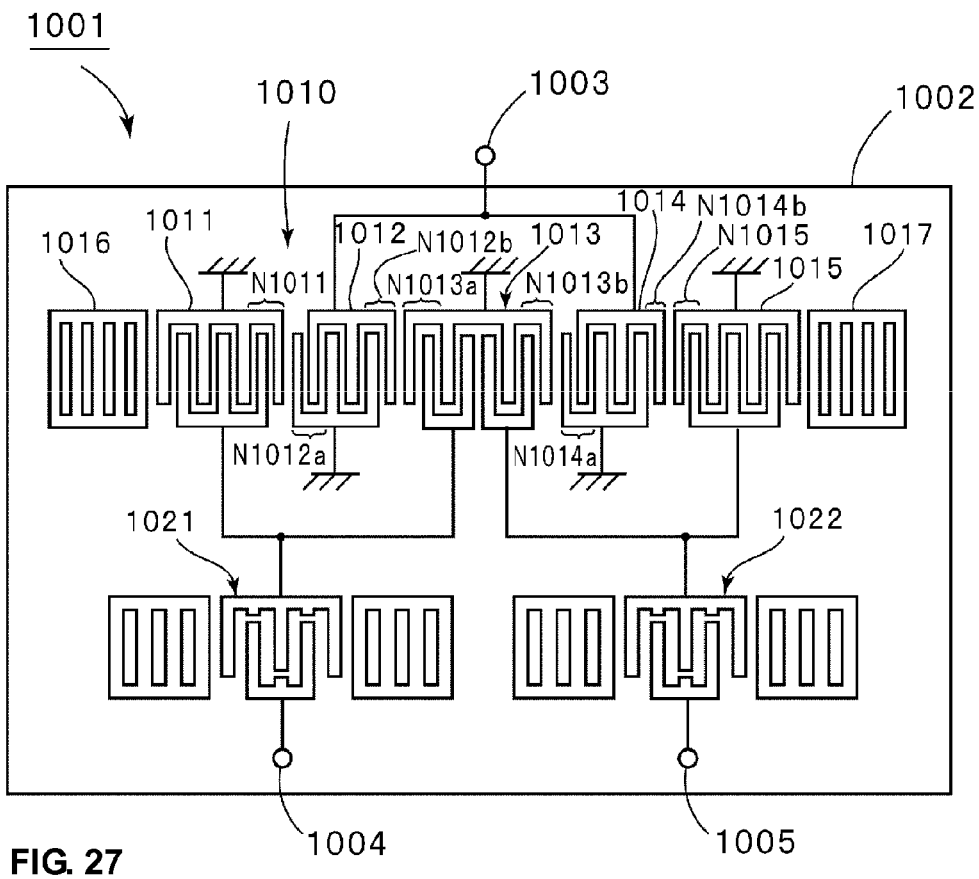
FIG. 26 is a schematic plan view of an example of a known elastic wave filter device.

FIG. 25 illustrates a relationship among the period of electrode fingers in a portion other than the narrow-pitch electrode finger portions of the third IDT electrode 11c, the period of electrode fingers in portions other than the narrow-pitch electrode finger portions of the first IDT electrode 11a and the fifth IDT electrode 11e, and the ripple Y, according to the modification.

In FIG. 25, the result is shown when the period of electrode fingers in a portion other than the narrow-pitch electrode finger portion of the third IDT electrode 11c and the period of electrode fingers in portions other than the narrow-pitch electrode finger portions of the first IDT electrode 11a and the fifth IDT electrode 11e are the same or substantially the same. The dotted line represents the result when the period of electrode fingers of the third IDT electrode 11c is greater than that of the first IDT electrode 11a and the fifth IDT electrode 11e by about 0.03 µm. The alternate long and short dash line represents the result when the period of electrode fingers in a portion other than the narrow-pitch electrode finger portion of the third IDT electrode 11c is greater than that of the first IDT electrode 11a and the fifth IDT electrode 11e by about 0.06 µm.

As can be seen from FIG. 25, similar to the example shown in FIG. 20, by using the period of electrode fingers in a portion other than the narrow-pitch electrode finger portions of the first IDT electrode 11a and the fifth IDT electrode 11e, which is different from that of the third IDT electrode 11c, the level of the ripple Y can be effectively controlled. More specifically, by setting the period of electrode fingers in a portion other than the narrow-pitch electrode finger portions of one of the first and fifth IDT electrodes 11a and 11e and the third IDT electrode 11c including a larger number of electrode fingers to be less than the period of electrode fingers in a portion other than the narrow-pitch electrode finger portion of the other IDT electrode, the ripple Y is increased. In this manner, the steepness of the filter characteristic is effectively increased.

In the modification of the second preferred embodiment, the period of electrode fingers in the narrow-pitch electrode finger portion B is preferably greater than the period of electrode fingers in the narrow-pitch electrode finger portion C. However, instead of setting the period of electrode fingers in the narrow-pitch electrode finger portion B to be greater than the period of electrode fingers in the narrow-pitch electrode finger portion C, the period of electrode fingers in the narrow-pitch electrode finger portion A may preferably be greater than the period of electrode fingers in the narrow-pitch electrode finger portion D.

Third Preferred Embodiment

A third preferred embodiment of the present invention is described below. Similar to the first preferred embodiment, the third preferred embodiment has the structure as shown in FIG. 1. Accordingly, the same reference numbers will be used to describe similar components in the third preferred embodiment, and the descriptions thereof are not repeated.

Figure 27:
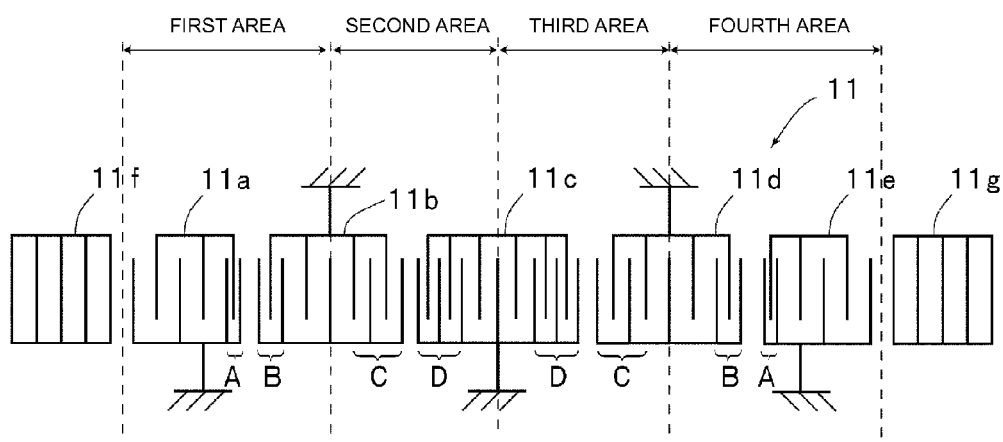
FIG. 27 is a schematic plan view of the structure of a narrow-pitch electrode finger portion of a first longitudinally coupled resonator type elastic wave filter portion of an elastic wave filter device according to a third preferred embodiment of the present invention.

As shown in FIG. 27, according to the third preferred embodiment, in a first longitudinally coupled resonator type elastic wave filter portion 11, the number of electrode fingers in a narrow-pitch electrode finger portion provided at each of the end of a second IDT electrode 11b adjacent to the first IDT electrode 11a and the end of a fourth IDT electrode 11d adjacent to the fifth IDT electrode 11e, that is, the number of electrode fingers in a narrow-pitch electrode finger portion B is preferably less than the number of electrode fingers in a narrow-pitch electrode finger portions provided at each of an end of the second IDT electrode 11b adjacent to the third IDT electrode 11c and an end of the fourth IDT electrode 11d adjacent to the third IDT electrode 11c, that is, the number of electrode fingers in a narrow-pitch electrode finger portion C. The period of electrode fingers in the narrow-pitch electrode finger portion B is preferably less than that in the narrow-pitch electrode finger portion C. The number of electrode fingers in the narrow-pitch electrode finger portion provided at each of an end of the first IDT electrode 11a and an end of the fifth IDT electrode 11e, that is, the number of electrode fingers in the narrow-pitch electrode finger portion A is preferably less than the number of electrode fingers in a narrow-pitch electrode finger portion provided at either end of the third IDT electrode 11c, that is, the number of electrode fingers in the narrow-pitch electrode finger portion D. The period of electrode fingers in the narrow-pitch electrode finger portion A is preferably less than that in the narrow-pitch electrode finger portion D. The period of electrode fingers in a portion other than the narrow-pitch electrode finger portions D of the third IDT electrode 11c is preferably less than the period of electrode fingers in portions other than the narrow-pitch electrode finger portions A of the first IDT electrode 11a and the fifth IDT electrode 11e. A second longitudinally coupled resonator type elastic wave filter portion 12 has a structure similar to that of the first longitudinally coupled resonator type elastic wave filter portion 11. Thus, in the elastic wave filter device 1, the steepness of the filter characteristic in the low frequency range of the passband is effectively increased. The reason for this is described with reference to FIG. 28.

Figure 28:
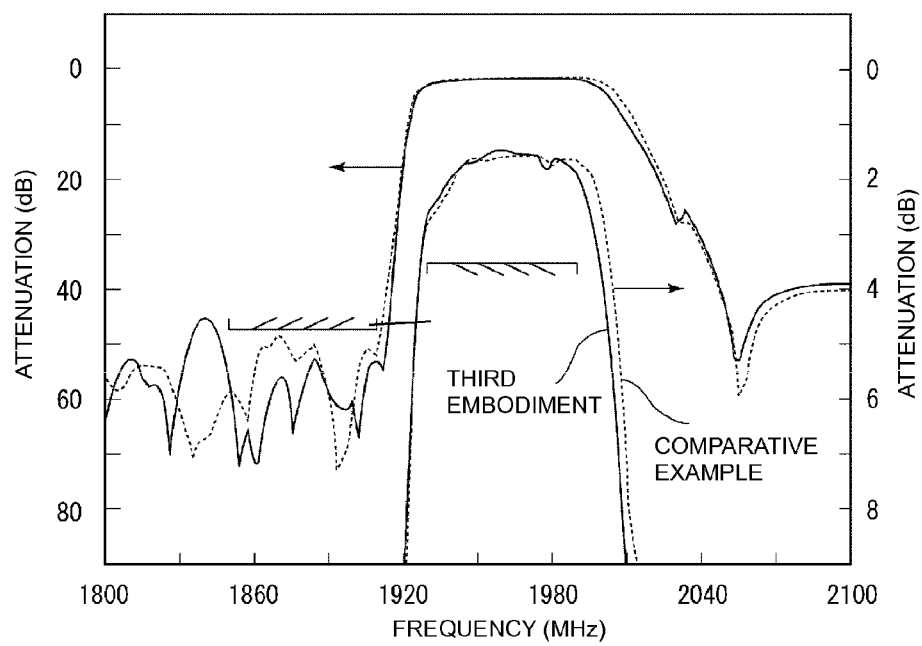
FIG. 28 illustrates the filter characteristics of an elastic wave filter device according to the third preferred embodiment of the present invention and an elastic wave filter device serving as a comparative example.

FIG. 28 illustrates the filter characteristic of an elastic wave filter device according to the third preferred embodiment. The solid line represents the result of the third preferred embodiment. The alternate long and short dash line represents the filter characteristic of an elastic wave filter device prepared as a comparative example. The detailed electrode structures of the third preferred embodiment and the comparative example are as follows. Note that, in the following description, the wavelength determined by the period of electrode fingers of an IDT electrode is denoted as "λI".

Specification of First Longitudinally Coupled Resonator Type Elastic Wave Filter Portion 11

Finger cross width of electrode fingers=about 16.9λI

The first IDT electrode 11a and fifth IDT electrode 11e: The number of electrode fingers of each of the IDT electrodes is 42 (note that the number of electrode fingers in the portion A is 3 out of 42).

The third IDT electrode 11c: The number of electrode fingers is 55 (note that the portions D each including 5 electrode fingers are provided at either side thereof).

The second IDT electrode 11b and fourth IDT electrode 11d: The number of electrode fingers of each of the electrodes is 43 (note that the number of electrode fingers in the narrow-pitch electrode finger portion B is 3, the number of electrode fingers in the narrow-pitch electrode finger portion C is 7, and the number of electrode fingers in the other portion is 33).

The number of electrode fingers of each of the first reflector 11f and the second reflector 11g: 65

The metallization ratio: about 0.68

The thickness of an electrode film: about 0.091λI

The period of electrode fingers in the narrow-pitch electrode finger portion B of each of the second IDT electrode 11b and the fourth IDT electrode 11d is less than that in the narrow-pitch electrode finger portion C by about 0.177 μm.

The period of electrode fingers in the narrow-pitch electrode finger portion A of each of the first IDT electrode 11a and the fifth IDT electrode 11e is less than that in the narrow-pitch electrode finger portion D of the third IDT electrode 11c by about 0.076 μm.

The period of electrode fingers in a portion other than the narrow-pitch electrode finger portion D of the third IDT electrode 11c is less than that in a portion other than the narrow-pitch electrode finger portion A of the first IDT electrode 11a and the fifth IDT electrode 11e by about 0.01 μm.

As described above, the structure of the second longitudinally coupled resonator type elastic wave filter portion 12 is similar to that of the first longitudinally coupled resonator type elastic wave filter portion 11, except that the phase of some IDT electrodes is preferably the inverse of the phase of the corresponding IDT electrodes.

Note that, as a comparative example, an elastic wave filter device having a structure similar to that of the third preferred embodiment except for the following structure is prepared:

the number of electrode fingers in each of the narrow-pitch electrode finger portions A to D is 4, and the period of electrode fingers in the narrow-pitch electrode finger portion A to D is the same.

As can be seen from FIG. 28, according to the third preferred embodiment, the steepness in the vicinity of the low frequency end ranging from about 1.930 GHz to about 1.990 GHz is increased, as compared to that of the comparative example. That is, in the stopband around 1.930 GHz and, more specifically, in the frequency range from about 1.900 GHz to about 1.930 GHz, the steepness is increased. Thus, for the through level of the filter characteristic, the frequency period for which the loss is about 3.5 dB to about 47.0 dB is decreased to a greater extent than that of the comparative example by about 3.8 MHz. If the frequency period is decreased, the tolerance for a variation in frequency caused by an assembly-to-assembly variation can be increased. Furthermore, the elastic wave filter device 1 having small degradation of the insertion loss and the attenuation even when the ambient temperature varies is provided.

Figure 29:
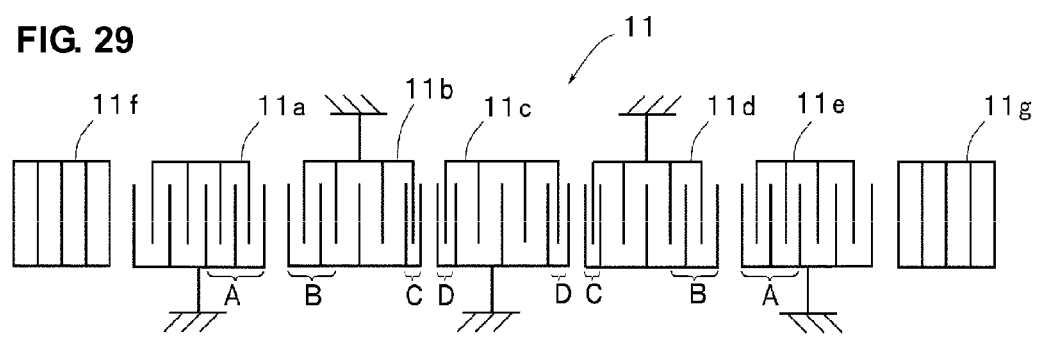
FIG. 29 is a schematic plan view of the structure of a narrow-pitch electrode finger portion of a first longitudinally coupled resonator type elastic wave filter portion of an elastic wave filter device according to a modification of the third preferred embodiment of the present invention.

Similar to the first and second preferred embodiments, in the third preferred embodiment, by using the opposite relationship between the number and period of electrode fingers, a modification having the same advantage is obtained. That is, in the modification of the third preferred embodiment, as shown in FIG. 29, the number of electrode fingers in the narrow-pitch electrode finger portion B is preferably greater than that in the narrow-pitch electrode finger portion C. The period of electrode fingers in the narrow-pitch electrode finger portion B is preferably greater than that in the narrow-pitch electrode finger portion C. In addition, the number of electrode fingers in the narrow-pitch electrode finger portion A is preferably greater than that in the narrow-pitch electrode finger portion D. The period of electrode fingers in the narrow-pitch electrode finger portion A is preferably greater than that in the narrow-pitch electrode finger portion D. Furthermore, the period of electrode fingers in portions other than the narrow-pitch electrode finger portions of the first IDT electrode 11a and the fifth IDT electrode 11e is preferably less than the period of electrode fingers in a portion other than the narrow-pitch electrode finger portions of the third IDT electrode 11c. In this manner, as in the third preferred embodiment, the ripple Y is increased and, therefore, the steepness of the filter characteristic in the low frequency range is effectively increased. In addition, the ripple Z is reduced.

More specifically, some of the specifications of the first longitudinally coupled resonator type elastic wave filter portion 11 can be changed as follows.

The first IDT electrode 11a and fifth IDT electrode 11e: The number of electrode fingers of each of the IDT electrodes is (note that the number of electrode fingers in the portion A is 5 out of 42).

The third IDT electrode 11c: The number of electrode fingers is 55 (note that the portions D each including 3 electrode fingers are provided at either side thereof).

The second IDT electrode 11b and fourth IDT electrode 11d: The number of electrode fingers of each of the electrodes is 43 (note that the number of electrode fingers in the narrow-pitch electrode finger portion B is 7, the number of electrode fingers in the narrow-pitch electrode finger portion C is 3, and the number of electrode fingers in the other portion is 33).

The period of electrode fingers in the narrow-pitch electrode finger portion B of each of the second IDT electrode 11b and the fourth IDT electrode 11d is preferably greater than that in the narrow-pitch electrode finger portion C by about 0.177 μm.

The period of electrode fingers in the narrow-pitch electrode finger portion A of each of the first IDT electrode 11a and the fifth IDT electrode 11e is preferably greater than that in the narrow-pitch electrode finger portion D of the third IDT electrode 11c by about 0.076 μm.

The period of electrode fingers in a portion other than the narrow-pitch electrode finger portions D of the third IDT electrode 11c is preferably greater than that in a portion other than the narrow-pitch electrode finger portion A of the first IDT electrode 11a and the fifth IDT electrode 11e by about 0.01 μm.

The structure of the second longitudinally coupled resonator type elastic wave filter portion 12 can preferably be similar to that of the first longitudinally coupled resonator type elastic wave filter portion 11 except that the phase of some IDT electrodes is preferably the inverse of the phase of the corresponding IDT electrodes.

Accordingly, the results from the above-described first to third preferred embodiments and the modifications are summarized as follows. That is, the number of electrode fingers in each of the narrow-pitch electrode finger portions A to D, the period of electrode fingers in each of the narrow-pitch electrode finger portions A to D, and the period of electrode fingers in main electrode finger portions other than the narrow-pitch electrode finger portions of the third IDT electrode 11c, the first IDT electrode 11a, and the fifth IDT electrode 11e can be designed as follows:

Structure 1

First Preferred Embodiment 1) the number of electrode fingers in the narrow-pitch electrode finger portion B<the number of electrode fingers in the narrow-pitch electrode finger portion C.

2) the period of electrode fingers in the narrow-pitch electrode finger portion B<the period of electrode fingers in the narrow-pitch electrode finger portion C, or the period of electrode fingers in the narrow-pitch electrode finger portion A<the period of electrode fingers in the narrow-pitch electrode finger portion D.

3) the period of electrode fingers in the main electrode finger portion of each of the first IDT electrode 11a and the fifth IDT electrode 11e>the period of electrode fingers in the main electrode finger portion of the third IDT electrode 11c.

Structure 2

Second Preferred Embodiment 1) the number of electrode fingers in the narrow-pitch electrode finger portion A<the number of electrode fingers in the narrow-pitch electrode finger portion D.

2) the period of electrode fingers in the narrow-pitch electrode finger portion B<the period of electrode fingers in the narrow-pitch electrode finger portion C, or the period of electrode fingers in the narrow-pitch electrode finger portion A<the period of electrode fingers in the narrow-pitch electrode finger portion D.

3) the period of electrode fingers in a main electrode finger portion of each of the first IDT electrode 11a and the fifth IDT electrode 11e>the period of electrode fingers in the main electrode finger portion of the third IDT electrode 11c.

Structure 3

Third Preferred Embodiment 1) the number of electrode fingers in the narrow-pitch electrode finger portion B<the number of electrode fingers in the narrow-pitch electrode finger portion C.

2) the number of electrode fingers in the narrow-pitch electrode finger portion A<the number of electrode fingers in the narrow-pitch electrode finger portion D.

3) the period of electrode fingers in the narrow-pitch electrode finger portion B<the period of electrode fingers in the narrow-pitch electrode finger portion C.

4) the period of electrode fingers in the narrow-pitch electrode finger portion A<the period of electrode fingers in the narrow-pitch electrode finger portion D.

5) the period of electrode fingers in a main electrode finger portion of each of the first IDT electrode 11a and the fifth IDT electrode 11e>the period of electrode fingers in the main electrode finger portion of the third IDT electrode 11c.

Structure 4

Modification of the First Preferred Embodiment 1) the number of electrode fingers in the narrow-pitch electrode finger portion B>the number of electrode fingers in the narrow-pitch electrode finger portion C.

2) the period of electrode fingers in the narrow-pitch electrode finger portion B>the period of electrode fingers in the narrow-pitch electrode finger portion C, or the period of electrode fingers in the narrow-pitch electrode finger portion A>the period of electrode fingers in the narrow-pitch electrode finger portion D.

3) the period of electrode fingers in the main electrode finger portion of each of the first IDT electrode 11a and the fifth IDT electrode 11e<the period of electrode fingers in the main electrode finger portion of the third IDT electrode 11c.

Structure 5

Modification of the Second Preferred Embodiment 1) the number of electrode fingers in the narrow-pitch electrode finger portion A>the number of electrode fingers in the narrow-pitch electrode finger portion D.

2) the period of electrode fingers in the narrow-pitch electrode finger portion B>the period of electrode fingers in the narrow-pitch electrode finger portion C, or the period of electrode fingers in the narrow-pitch electrode finger portion A>the period of electrode fingers in the narrow-pitch electrode finger portion D.

3) the period of electrode fingers in the main electrode finger portion of each of the first IDT electrode 11a and the fifth IDT electrode 11e<the period of electrode fingers in the main electrode finger portion of the third IDT electrode 11c.

Structure 6

Third Preferred Embodiment 1) the number of electrode fingers in the narrow-pitch electrode finger portion B>the number of electrode fingers in the narrow-pitch electrode finger portion C.

2) the number of electrode fingers in the narrow-pitch electrode finger portion A>the number of electrode fingers in the narrow-pitch electrode finger portion D.

3) the period of electrode fingers in the narrow-pitch electrode finger portion B>the period of electrode fingers in the narrow-pitch electrode finger portion C.

4) the period of electrode fingers in the narrow-pitch electrode finger portion A>the period of electrode fingers in the narrow-pitch electrode finger portion D.

5) the period of electrode fingers in the main electrode finger portion of each of the first IDT electrode 11a and the fifth IDT electrode 11e<the period of electrode fingers in the main electrode finger portion of the third IDT electrode 11c.

A relationship between the number of electrode fingers and the period of electrode fingers of the elastic wave filter device according to the various preferred embodiments of the present invention is summarized below with reference to FIG. 3.

As shown in FIG. 3, an area including the first IDT electrode 11a and a half of the second IDT electrode 11b neighboring the first IDT electrode 11a is defined as a first area, an area including a half of the second IDT electrode 11b neighboring the third IDT electrode 11c and a half of the third IDT electrode 11c neighboring the second IDT electrode 11b is defined as a second area, an area including a half of the third IDT electrode 11c neighboring the fourth IDT electrode 11d and a half of the fourth IDT electrode 11d neighboring the third IDT electrode 11c is defined as a third area, and an area including a half of the fourth IDT electrode 11d neighboring the fifth IDT electrode 11e and the fifth IDT electrode 11e is defined as a fourth area.

According to the first preferred embodiment of the present invention, the total number of the electrode fingers in the narrow-pitch electrode finger portions A and B included in the first area is preferably less than the total number of the electrode fingers in the narrow-pitch electrode finger portions C and D included in the second area. The total number of the electrode fingers in the narrow-pitch electrode finger portions C and D included in the third area is preferably greater than the total number of the electrode fingers in the narrow-pitch electrode finger portions A and B included in the fourth area. Let Nx denote each of the total number of electrode fingers in the narrow-pitch electrode finger portions included in the first area and the total number of electrode fingers in the narrow-pitch electrode finger portions included in the fourth area. Let Ny denote each of the total number of electrode fingers in the narrow-pitch electrode finger portions included in the second area and the total number of electrode fingers in the narrow-pitch electrode finger portions included in the third area. Then, the average period of the narrow-pitch electrode finger portion in the area including larger total numbers of electrode fingers Nx and Ny is preferably greater than that in the area including smaller total numbers of electrode fingers Nx and Ny. In addition, among the first IDT electrode 11a, the third IDT electrode 11c, and the fifth IDT electrode 11e, the period of electrode fingers in a portion other than the narrow-pitch electrode finger portion of the IDT electrode included in the area including the larger numbers of electrode fingers is preferably less than the period of electrode fingers in a portion other than the narrow-pitch electrode finger portion of the IDT electrode included in the area including the smaller numbers of electrode fingers.

According to the second preferred embodiment of the present invention, the total number of electrode fingers in the narrow-pitch electrode finger portions A and B included in the first area is preferably less than the total number of electrode fingers in the narrow-pitch electrode finger portions C and D included in the second area. The total number of electrode fingers in the narrow-pitch electrode finger portions C and D included in the third area is preferably greater than the total number of electrode fingers in the narrow-pitch electrode finger portions A and B included in the fourth area. Let Nx denote each of the total number of electrode fingers of the narrow-pitch electrode finger portions A and B included in the first area and the total number of electrode fingers of the narrow-pitch electrode finger portions included in the fourth area. Let Ny denote each of the total number of electrode fingers in the narrow-pitch electrode finger portions included in the second area and the total number of electrode fingers in the narrow-pitch electrode finger portions included in the third area. Then, the average period of electrode fingers in the narrow-pitch electrode finger portions in the area including the larger total numbers of electrode fingers Nx and Ny is greater than that in the area including the smaller total numbers of electrode fingers Nx and Ny. Among the first IDT electrode 11a, the third IDT electrode 11c, and the fifth IDT electrode 11e, the period of electrode fingers in a portion other than the narrow-pitch electrode finger portion of the IDT electrode included in the area including the larger numbers of electrode fingers is preferably less than the period of electrode fingers in a portion other than the narrow-pitch electrode finger portion of the IDT electrode included in the area including the smaller numbers of electrode fingers.

Furthermore, a relationship between the number of electrode fingers and the period of a surface acoustic wave filter provided in the first and second preferred embodiments of the present invention is summarized below. Let Nx denote each of the total number of electrode fingers of the narrow-pitch electrode finger portions A and B included in the first area and the total number of electrode fingers of the narrow-pitch electrode finger portions included in the fourth area. Let Ny denote each of the total number of electrode fingers in the narrow-pitch electrode finger portions included in the second area and the total number of electrode fingers in the narrow-pitch electrode finger portions included in the third area. Then, the total number of electrode fingers Nx is preferably different from the total number of electrode fingers Ny. The average period of electrode fingers in the narrow-pitch electrode finger portions included in the area including the larger total numbers of electrode fingers Nx and Ny is preferably greater than that included in the area including the smaller total numbers of electrode fingers Nx and Ny. Among the first IDT electrode, the third IDT electrode, and the fifth IDT electrode, the period of electrode fingers in a portion other than the narrow-pitch electrode finger portion of the IDT electrode included in the area including the larger numbers of electrode fingers is preferably less than the period of electrode fingers in a portion other than the narrow-pitch electrode finger portion of the IDT electrode included in the area including the smaller numbers of electrode fingers.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave filter device comprising:
a piezoelectric substrate;
first to fifth IDT electrodes sequentially arranged on the piezoelectric substrate in a direction in which elastic waves propagate; and
first and second reflectors arranged on either side of an area in which the first to fifth IDT electrodes are provided in the direction in which elastic waves propagate; wherein
the first to fifth IDT electrodes and the first and second reflectors define a longitudinally coupled resonator type elastic wave filter portion, and each of the first to fifth IDT electrodes includes a narrow-pitch electrode finger portion in which a period of electrode fingers is less than that in another portion at an end adjacent to a different of the first to fifth IDT electrodes;
along the direction in which elastic waves propagate, an area including the first IDT electrode and a half of the second IDT electrode neighboring the first IDT electrode is defined as a first area, an area including a half of the second IDT electrode neighboring the third IDT electrode and a half of the third IDT electrode neighboring the second IDT electrode is defined as a second area, an area including a half of the third IDT electrode neighboring the fourth IDT electrode and a half of the fourth IDT electrode neighboring the third IDT electrode is defined as a third area, and an area including a half of the fourth IDT electrode neighboring the fifth IDT electrode and the fifth IDT electrode is defined as a fourth area;
when each of total numbers of electrode fingers in the narrow-pitch electrode finger portions in the first area and in the fourth area is Nx and each of total numbers of electrode fingers in the narrow-pitch electrode finger portions in the second area and in the third area is Ny, the number of electrode fingers Nx is different from the number of electrode fingers Ny;
an average period of electrode fingers in the narrow-pitch electrode finger portion located in an area including a larger number of electrode fingers between Nx and Ny is greater than an average period of electrode fingers in the narrow-pitch electrode finger portion located in an area including a smaller number of electrode fingers between Nx and Ny; and
among the first, third, and fifth IDT electrodes, a period of electrode fingers in a portion other than the narrow-pitch electrode finger portion of the IDT electrode included in the area including the larger number of electrode fingers is less than that included in the area including the smaller number of electrode fingers.

2. The elastic wave filter device according to claim 1, wherein
the total number of electrode fingers in the narrow-pitch electrode finger portions included in the first area is less than the total number of electrode fingers in the narrow-pitch electrode finger portions included in the second area; and
the total number of electrode fingers in the narrow-pitch electrode finger portions included in the third area is greater than the total number of electrode fingers in the narrow-pitch electrode finger portions included in the fourth area.

3. The elastic wave filter device according to claim 2, wherein
the number of electrode fingers in the narrow-pitch electrode finger portion of the second IDT electrode included in the first area is less than the number of electrode fingers in the narrow-pitch electrode finger portion of the second IDT electrode included in the second area;
the number of electrode fingers in the narrow-pitch electrode finger portion of the fourth IDT electrode included in the third area is greater than the number of electrode fingers in the narrow-pitch electrode finger portion of the fourth IDT electrode included in the fourth area;
a period of electrode fingers in the narrow-pitch electrode finger portion of the second IDT electrode included in the first area is less than a period of electrode fingers in the narrow-pitch electrode finger portion of the second IDT electrode included in the second area;
a period of electrode fingers in the narrow-pitch electrode finger portion of the fourth IDT electrode included in the third area is greater than a period of electrode fingers in the narrow-pitch electrode finger portion of the fourth IDT electrode included in the fourth area; and
a period of electrode fingers in a portion other than the narrow-pitch electrode finger portions of the third IDT electrode is less than a period of electrode fingers in a portion other than the narrow-pitch electrode finger portions of each of the first IDT electrode and the fifth IDT electrode.

4. The elastic wave filter device according to claim 2, wherein
the number of electrode fingers in the narrow-pitch electrode finger portion of the second IDT electrode included in the first area is less than the number of electrode fingers in the narrow-pitch electrode finger portion of the second IDT electrode included in the second area;
the number of electrode fingers in the narrow-pitch electrode finger portion of the fourth IDT electrode included in the third area is greater than the number of electrode fingers in the narrow-pitch electrode finger portion of the fourth IDT electrode included in the fourth area;
a period of electrode fingers in the narrow-pitch electrode finger portion of the first IDT electrode included in the first area is less than the period of electrode fingers in the narrow-pitch electrode finger portion of the third IDT electrode included in the second area;
a period of electrode fingers in the narrow-pitch electrode finger portion of the third IDT electrode included in the third area is greater than a period of electrode fingers in the narrow-pitch electrode finger portion of the fifth IDT electrode included in the fourth area; and
a period of electrode fingers in a portion other than the narrow-pitch electrode finger portions of the third IDT electrode is less than a period of electrode fingers in a portion other than the narrow-pitch electrode finger portions of each of the first IDT electrode and the fifth IDT electrode.

5. The elastic wave filter device according to claim 2, wherein
the number of electrode fingers in the narrow-pitch electrode finger portion of the first IDT electrode included in the first area is less than the number of electrode fingers in the narrow-pitch electrode finger portion of the third IDT electrode included in the second area;

the number of electrode fingers in the narrow-pitch electrode finger portion of the third IDT electrode included in the third area is greater than the number of electrode fingers in the narrow-pitch electrode finger portion of the fifth IDT electrode included in the fourth area;

a period of electrode fingers in the narrow-pitch electrode finger portion of the second IDT electrode included in the first area is less than a period of electrode fingers in the narrow-pitch electrode finger portion of the second IDT electrode included in the second area;

a period of electrode fingers in the narrow-pitch electrode finger portion of the fourth IDT electrode included in the third area is greater than a period of electrode fingers in the narrow-pitch electrode finger portion of the fourth IDT electrode included in the fourth area; and a period of electrode fingers in a portion other than the narrow-pitch electrode finger portions of the third IDT electrode is less than a period of electrode fingers in a portion other than the narrow-pitch electrode finger portions of each of the first IDT electrode and the fifth IDT electrode.

6. The elastic wave filter device according to claim 2, wherein the number of electrode fingers in the narrow-pitch electrode finger portion of the first IDT electrode included in the first area is less than the number of electrode fingers in the narrow-pitch electrode finger portion of the third IDT electrode included in the second area;

the number of electrode fingers in the narrow-pitch electrode finger portion of the third IDT electrode included in the third area is greater than the number of electrode fingers in the narrow-pitch electrode finger portion of the fifth IDT electrode included in the fourth area;

a period of electrode fingers in the narrow-pitch electrode finger portion of the first IDT electrode included in the first area is less than the period of electrode fingers in the narrow-pitch electrode finger portion of the third IDT electrode included in the second area;

a period of electrode fingers in the narrow-pitch electrode finger portion of the third IDT electrode included in the third area is greater than a period of electrode fingers of the fifth IDT electrode included in the fourth area; and a period of electrode fingers in a portion other than the narrow-pitch electrode finger portions of the third IDT electrode is less than a period of electrode fingers in a portion other than the narrow-pitch electrode finger portions of each of the first IDT electrode and the fifth IDT electrode.

7. The elastic wave filter device according to claim 2, wherein the number of electrode fingers in the narrow-pitch electrode finger portion of the first IDT electrode included in the first area is less than the number of electrode fingers in the narrow-pitch electrode finger portion of the third IDT electrode included in the second area;

the number of electrode fingers in the narrow-pitch electrode finger portion of the second IDT electrode included in the first area is less than the number of electrode fingers in the narrow-pitch electrode finger portion of the second IDT electrode included in the second area;

the number of electrode fingers in the narrow-pitch electrode finger portion of the fourth IDT electrode included in the third area is greater than the number of electrode fingers in the narrow-pitch electrode finger portion of the fourth IDT electrode included in the fourth area;

the number of electrode fingers in the narrow-pitch electrode finger portion of the third IDT electrode included in the third area is greater than the number of electrode fingers in the narrow-pitch electrode finger portion of the fifth IDT electrode included in the fourth area;

a period of electrode fingers in the narrow-pitch electrode finger portion of the first IDT electrode included in the first area is less than a period of electrode fingers in the narrow-pitch electrode finger portion of the third IDT electrode included in the second area;

a period of electrode fingers in the narrow-pitch electrode finger portion of the second IDT electrode included in the first area is less than a period of electrode fingers in the narrow-pitch electrode finger portion of the second IDT electrode included in the second area;

a period of electrode fingers in the narrow-pitch electrode finger portion of the fourth IDT electrode included in the third area is greater than a period of electrode fingers in the narrow-pitch electrode finger portion of the fourth IDT electrode included in the fourth area;

a period of electrode fingers in the narrow-pitch electrode finger portion of the third IDT electrode included in the third area is greater than a period of electrode fingers in the narrow-pitch electrode finger portion of the fifth IDT electrode included in the fourth area; and a period of electrode fingers in a portion other than the narrow-pitch electrode finger portions of the third IDT electrode is less than a period of electrode fingers in a portion other than the narrow-pitch electrode finger portions of each of the first IDT electrode and the fifth IDT electrode.

8. The elastic wave filter device according to claim 1, wherein the total number of electrode fingers in the narrow-pitch electrode finger portions included in the first area is greater than the total number of electrode fingers in the narrow-pitch electrode finger portions included in the second area; and the total number of electrode fingers in the narrow-pitch electrode finger portions included in the third area is less than the total number of electrode fingers in the narrow-pitch electrode finger portions included in the fourth area.

9. The elastic wave filter device according to claim 8, wherein the number of electrode fingers in the narrow-pitch electrode finger portion of the second IDT electrode included in the first area is greater than the number of electrode fingers in the narrow-pitch electrode finger portion of the second IDT electrode included in the second area;

the number of electrode fingers in the narrow-pitch electrode finger portion of the fourth IDT electrode included in the third area is less than the number of electrode fingers in the narrow-pitch electrode finger portion of the fourth IDT electrode included in the fourth area;

a period of electrode fingers in the narrow-pitch electrode finger portion of the second IDT electrode included in the first area is greater than a period of electrode fingers in the narrow-pitch electrode finger portion of the second IDT electrode included in the second area;

a period of electrode fingers in the narrow-pitch electrode finger portion of the fourth IDT electrode included in the third area is less than a period of electrode fingers in the narrow-pitch electrode finger portion of the fourth IDT electrode included in the fourth area; and a period of electrode fingers in a portion other than the narrow-pitch electrode finger portions of the third IDT electrode is greater than the period of electrode fingers in a portion other than the narrow-pitch electrode finger portions of each of the first IDT electrode and the fifth IDT electrode.

10. The elastic wave filter device according to claim 8, wherein
- the number of electrode fingers in the narrow-pitch electrode finger portion of the second IDT electrode included in the first area is greater than the number of electrode fingers in the narrow-pitch electrode finger portion of the second IDT electrode included in the second area;
- the number of electrode fingers in the narrow-pitch electrode finger portion of the fourth IDT electrode included in the third area is less than the number of electrode fingers in the narrow-pitch electrode finger portion of the fourth IDT electrode included in the fourth area;
- a period of electrode fingers in the narrow-pitch electrode finger portion of the first IDT electrode included in the first area is greater than a period of electrode fingers in the narrow-pitch electrode finger portion of the third IDT electrode included in the second area;
- a period of electrode fingers in the narrow-pitch electrode finger portion of the third IDT electrode included in the third area is less than a period of electrode fingers in the narrow-pitch electrode finger portion of the fifth IDT electrode included in the fourth area; and
- a period of electrode fingers in a portion other than the narrow-pitch electrode finger portions of the third IDT electrode is greater than a period of electrode fingers in a portion other than the narrow-pitch electrode finger portions of each of the first IDT electrode and the fifth IDT electrode.

11. The elastic wave filter device according to claim 8, wherein
- the number of electrode fingers in the narrow-pitch electrode finger portion of the first IDT electrode included in the first area is greater than the number of electrode fingers in the narrow-pitch electrode finger portion of the third IDT electrode included in the second area;
- the number of electrode fingers in the narrow-pitch electrode finger portion of the third IDT electrode included in the third area is less than the number of electrode fingers in the narrow-pitch electrode finger portion of the fifth IDT electrode included in the fourth area;
- a period of electrode fingers in the narrow-pitch electrode finger portion of the second IDT electrode included in the first area is greater than the period of electrode fingers in the narrow-pitch electrode finger portion of the second IDT electrode included in the second area;
- a period of electrode fingers in the narrow-pitch electrode finger portion of the fourth IDT electrode included in the third area is less than a period of electrode fingers in the narrow-pitch electrode finger portion of the fourth IDT electrode included in the fourth area; and
- a period of electrode fingers in a portion other than the narrow-pitch electrode finger portions of the third IDT electrode is greater than a period of electrode fingers in a portion other than the narrow-pitch electrode finger portions of each of the first IDT electrode and the fifth IDT electrode.

12. The elastic wave filter device according to claim 8, wherein
- the number of electrode fingers in the narrow-pitch electrode finger portion of the first IDT electrode included in the first area is greater than the number of electrode fingers in the narrow-pitch electrode finger portion of the third IDT electrode included in the second area;
- the number of electrode fingers in the narrow-pitch electrode finger portion of the third IDT electrode included in the third area is less than the number of electrode fingers in the narrow-pitch electrode finger portion of the fifth IDT electrode included in the fourth area;
- a period of electrode fingers in the narrow-pitch electrode finger portion of the first IDT electrode included in the first area is greater than a period of electrode fingers in the narrow-pitch electrode finger portion of the third IDT electrode in the second area;
- a period of electrode fingers in the narrow-pitch electrode finger portion of the third IDT electrode included in the third area is less than a period of electrode fingers in the narrow-pitch electrode finger portion of the fifth IDT electrode included in the fourth area; and
- a period of electrode fingers in a portion other than the narrow-pitch electrode finger portions of the third IDT electrode is greater than a period of electrode fingers in a portion other than the narrow-pitch electrode finger portions of each of the first IDT electrode and the fifth IDT electrode.

13. The elastic wave filter device according to claim 8, wherein
- the number of electrode fingers in the narrow-pitch electrode finger portion of the first IDT electrode included in the first area is greater than the number of electrode fingers in the narrow-pitch electrode finger portion of the third IDT electrode included in the second area;
- the number of electrode fingers in the narrow-pitch electrode finger portion of the second IDT electrode included in the first area is greater than the number of electrode fingers in the narrow-pitch electrode finger portion of the second IDT electrode included in the second area;
- the number of electrode fingers in the narrow-pitch electrode finger portion of the fourth IDT electrode included in the third area is less than the number of electrode fingers in the narrow-pitch electrode finger portion of the fourth IDT electrode included in the fourth area;
- the number of electrode fingers in the narrow-pitch electrode finger portion of the third IDT electrode included in the third area is less than the number of electrode fingers in the narrow-pitch electrode finger portion of the fifth IDT electrode included in the fourth area;
- a period of electrode fingers in the narrow-pitch electrode finger portion of the first IDT electrode included in the first area is greater than the period of electrode fingers in the narrow-pitch electrode finger portion of the third IDT electrode included in the second area;
- a period of electrode fingers in the narrow-pitch electrode finger portion of the second IDT electrode included in the first area is greater than a period of electrode fingers in the narrow-pitch electrode finger portion of the second IDT electrode included in the second area;
- a period of electrode fingers in the narrow-pitch electrode finger portion of the fourth IDT electrode included in the third area is less than the period of electrode fingers in the narrow-pitch electrode finger portion of the fourth IDT electrode included in the fourth area;
- a period of electrode fingers in the narrow-pitch electrode finger portion of the third IDT electrode included in the third area is less than a period of electrode fingers in the narrow-pitch electrode finger portion of the fifth IDT electrode included in the fourth area; and
- a period of electrode fingers in a portion other than the narrow-pitch electrode finger portions of the third IDT electrode is greater than a period of electrode fingers in a portion other than the narrow-pitch electrode finger portions of each of the first IDT electrode and the fifth IDT electrode.

\* \* \* \* \*

UNITED STATES PATENT AND TRADEMARK OFFICE
CERTIFICATE OF CORRECTION

| | |
|---|---|
| PATENT NO. | : 8,339,221 B2 |
| APPLICATION NO. | : 13/044647 |
| DATED | : December 25, 2012 |
| INVENTOR(S) | : Yuichi Takamine |

It is certified that error appears in the above-identified patent and that said Letters Patent is hereby corrected as shown below:

On the title page add:

Related U.S. Application Data

(63) Continuation of Application No. PCT/JP2009/003950, filed on August 19, 2009

On the title page OTHER PUBLICATIONS, should read:

(56) Official Communication issued in International Patent Application No. PCT/JP2009/003950, mailed on September 29, 2009

Signed and Sealed this
Fifth Day of March, 2013

Teresa Stanek Rea
*Acting Director of the United States Patent and Trademark Office*